United States Patent
Dragone et al.

(10) Patent No.: US 10,426,037 B2
(45) Date of Patent: Sep. 24, 2019

(54) CIRCUITIZED STRUCTURE WITH 3-DIMENSIONAL CONFIGURATION

(71) Applicant: INTERNATIONAL BUSINESS MACHINES CORPORATION, Armonk, NY (US)

(72) Inventors: Silvio Dragone, Winterthur (CH); Stefano S. Oggioni, Milan (IT); William Santiago Fernandez, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 266 days.

(21) Appl. No.: 14/799,785

(22) Filed: Jul. 15, 2015

(65) Prior Publication Data
US 2017/0019987 A1     Jan. 19, 2017

(51) Int. Cl.
*H05K 3/00* (2006.01)
*H05K 1/02* (2006.01)
(Continued)

(52) U.S. Cl.
CPC ......... *H05K 3/0014* (2013.01); *H05K 1/0203* (2013.01); *H05K 1/0275* (2013.01);
(Continued)

(58) Field of Classification Search
CPC ........ H05K 1/028; H05K 1/115; H05K 1/189; H05K 1/181; H05K 1/0298; H05K 1/09;
(Continued)

(56) References Cited

U.S. PATENT DOCUMENTS

| 3,165,569 A | 1/1965 | Bright et al. |
| 3,214,315 A * | 10/1965 | Hildebrand ............ H05K 3/041 |
| | | 156/222 |

(Continued)

FOREIGN PATENT DOCUMENTS

| CN | 2014-30639 Y | 3/2010 |
| CN | 10-4346587 A | 2/2015 |

(Continued)

OTHER PUBLICATIONS

Dragone, Silvio et al., "Circuitized Structure With 3-Dimensional Configuration," U.S. Appl. No. 15/194,706, filed Jun. 28, 2016, pp. 1-39.

(Continued)

*Primary Examiner* — James Wu
*Assistant Examiner* — Michael A Matey
(74) *Attorney, Agent, or Firm* — Tihon Poltavets, Esq.; Kevin P. Radigan, Esq.; Heslin Rothenberg Farley & Mesiti P.C.

(57) ABSTRACT

A circuitized structure with a 3-dimensional configuration. A base structure is provided that includes an insulating substrate of electrically insulating material with a flat configuration, and further includes an electric circuit including at least one layer of electrically conductive material arranged on the insulating substrate. The insulating material includes a thermosetting material being partially cured by stopping a cure thereof at a B-stage before reaching a gel point. The base structure is formed according to the 3-dimensional configuration, and the cure of the thermosetting material is completed.

17 Claims, 8 Drawing Sheets

(51) Int. Cl.
  *H05K 1/18* (2006.01)
  *H05K 3/02* (2006.01)
(52) U.S. Cl.
  CPC .......... *H05K 1/0284* (2013.01); *H05K 1/181* (2013.01); *H05K 3/0011* (2013.01); *H05K 3/02* (2013.01); *H05K 2201/10037* (2013.01); *H05K 2203/1305* (2013.01)
(58) Field of Classification Search
  CPC .. H05K 1/0283; H05K 3/4644; H05K 3/4691; H05K 1/185; H05K 1/036; H05K 1/0393; H05K 2201/0154; H05K 1/0212; H05K 2201/066; H05K 2201/10515; H05K 2201/1053; H05K 2201/10977; H05K 2201/041; H05K 2201/09127; H05K 3/4611; H05K 3/4694
  See application file for complete search history.

(56) References Cited

U.S. PATENT DOCUMENTS

| | | | |
|---|---|---|---|
| 3,330,695 A * | 7/1967 | Curran | H05K 1/05 427/102 |
| 4,160,503 A | 7/1979 | Ohlbach | |
| 4,211,324 A | 7/1980 | Ohlback | |
| 4,324,823 A | 4/1982 | Ray, III | |
| 4,516,679 A | 5/1985 | Simpson | |
| 4,496,900 A | 6/1985 | Di Stefano et al. | |
| 4,593,384 A | 6/1986 | Kleinjne | |
| 4,609,104 A | 9/1986 | Kasper et al. | |
| 4,653,252 A | 3/1987 | Van de Haar et al. | |
| 4,677,252 A * | 6/1987 | Takahashi | H05K 1/056 174/254 |
| 4,677,809 A | 7/1987 | Long et al. | |
| 4,691,350 A | 9/1987 | Kleijne et al. | |
| 4,807,284 A | 2/1989 | Kleijne | |
| 4,811,288 A | 3/1989 | Kleijne et al. | |
| 4,847,139 A | 7/1989 | Wolf et al. | |
| 4,860,351 A | 8/1989 | Weingart | |
| 4,865,197 A | 9/1989 | Craig | |
| 4,912,288 A * | 3/1990 | Atkinson | B29C 45/0053 174/251 |
| 5,009,311 A | 4/1991 | Schenk | |
| 5,027,397 A | 6/1991 | Double et al. | |
| 5,060,114 A | 10/1991 | Feinberg et al. | |
| 5,075,822 A | 12/1991 | Baumler et al. | |
| 5,117,457 A | 5/1992 | Comerford et al. | |
| 5,159,629 A | 10/1992 | Double et al. | |
| 5,185,717 A | 2/1993 | Mori | |
| 5,201,868 A | 4/1993 | Johnson | |
| 5,201,879 A | 4/1993 | Steele et al. | |
| 5,211,618 A | 5/1993 | Stoltz | |
| 5,239,664 A | 8/1993 | Verrier et al. | |
| 5,243,162 A | 9/1993 | Kobayashi | |
| 5,389,738 A | 2/1995 | Piosenka et al. | |
| 5,406,630 A | 4/1995 | Piosenka et al. | |
| 5,434,362 A * | 7/1995 | Klosowiak | H05K 1/028 174/254 |
| 5,506,566 A | 4/1996 | Oldfield et al. | |
| 5,568,124 A | 10/1996 | Joyce et al. | |
| 5,594,439 A | 1/1997 | Swanson | |
| 5,675,319 A | 10/1997 | Rivenberg et al. | |
| 5,715,652 A | 2/1998 | Stahlecker | |
| 5,721,323 A | 2/1998 | Schultz et al. | |
| 5,761,054 A | 6/1998 | Kuhn | |
| 5,813,113 A | 9/1998 | Stewart et al. | |
| 5,858,500 A | 1/1999 | MacPherson | |
| 5,880,523 A | 3/1999 | Candelore | |
| 5,988,510 A | 11/1999 | Tuttle et al. | |
| 6,038,133 A * | 3/2000 | Nakatani | G06F 17/3089 174/255 |
| 6,121,544 A | 9/2000 | Petsinger | |
| 6,195,267 B1 | 2/2001 | MacDonald, Jr. et al. | |
| 6,201,296 B1 | 3/2001 | Fries et al. | |
| 6,261,215 B1 | 7/2001 | Imer | |
| 6,301,096 B1 | 10/2001 | Wozniczka | |
| 6,384,397 B1 | 5/2002 | Takiar et al. | |
| 6,395,992 B1 * | 5/2002 | Nakayama | H05K 1/056 174/254 |
| 6,424,954 B1 | 7/2002 | Leon | |
| 6,438,825 B1 | 8/2002 | Kuhm | |
| 6,469,625 B1 | 10/2002 | Tomooka | |
| 6,473,995 B2 | 11/2002 | Miyakawa et al. | |
| 6,512,454 B2 | 1/2003 | Miglioli et al. | |
| 6,686,539 B2 | 2/2004 | Farquhar et al. | |
| 6,746,960 B2 | 6/2004 | Goodman et al. | |
| 6,798,660 B2 | 9/2004 | Moss et al. | |
| 6,853,093 B2 | 2/2005 | Cohen et al. | |
| 6,879,032 B2 | 4/2005 | Rosenau et al. | |
| 6,895,509 B1 | 5/2005 | Clark | |
| 6,929,900 B2 | 8/2005 | Farquhar et al. | |
| 6,946,960 B2 | 9/2005 | Sisson et al. | |
| 6,957,345 B2 | 10/2005 | Cesana et al. | |
| 6,970,360 B2 | 11/2005 | Sinha | |
| 6,985,362 B2 | 1/2006 | Mori et al. | |
| 6,991,961 B2 | 1/2006 | Hubbard et al. | |
| 6,996,953 B2 | 2/2006 | Perreault et al. | |
| 7,005,584 B2 * | 2/2006 | Levi | H05K 1/14 174/254 |
| 7,005,733 B2 | 2/2006 | Kommerling et al. | |
| 7,015,823 B1 | 5/2006 | Gillen et al. | |
| 7,054,162 B2 | 5/2006 | Benson et al. | |
| 7,057,896 B2 | 6/2006 | Matsuo et al. | |
| 7,094,143 B2 | 8/2006 | Wolm et al. | |
| 7,094,459 B2 | 8/2006 | Takahashi | |
| 7,095,615 B2 | 8/2006 | Nichols | |
| 7,156,233 B2 | 1/2007 | Clark et al. | |
| 7,180,008 B2 | 2/2007 | Heitmann et al. | |
| 7,189,360 B1 | 3/2007 | Ho et al. | |
| 7,214,874 B2 | 5/2007 | Dangler et al. | |
| 7,247,791 B2 | 7/2007 | Kulpa | |
| 7,304,373 B2 | 12/2007 | Taggart et al. | |
| 7,310,737 B2 | 12/2007 | Patel et al. | |
| 7,465,887 B2 | 12/2008 | Suzuki et al. | |
| 7,475,474 B2 | 1/2009 | Heitmann et al. | |
| 7,515,418 B2 | 4/2009 | Straznicky et al. | |
| 7,549,064 B2 | 6/2009 | Elbert et al. | |
| 7,640,658 B1 | 1/2010 | Pham et al. | |
| 7,643,290 B1 | 1/2010 | Narasimhan et al. | |
| 7,663,883 B2 | 2/2010 | Shirakami et al. | |
| 7,672,129 B1 | 3/2010 | Ouyang et al. | |
| 7,731,517 B2 | 6/2010 | Lee et al. | |
| 7,746,657 B2 | 6/2010 | Oprea et al. | |
| 7,760,086 B2 | 7/2010 | Hunter et al. | |
| 7,768,005 B2 | 8/2010 | Condorelli et al. | |
| 7,783,994 B2 | 8/2010 | Ball et al. | |
| 7,787,256 B2 | 8/2010 | Chan et al. | |
| 7,830,021 B1 | 11/2010 | Wilcoxon et al. | |
| 7,868,411 B2 | 1/2011 | Kim et al. | |
| 7,898,413 B2 | 3/2011 | Hsu et al. | |
| 7,901,977 B1 | 3/2011 | Angelopoulos et al. | |
| 7,947,911 B1 | 5/2011 | Pham et al. | |
| 7,978,070 B2 | 7/2011 | Hunter | |
| 8,006,101 B2 | 8/2011 | Crawford | |
| 8,084,855 B2 | 12/2011 | Lower et al. | |
| 8,094,450 B2 | 1/2012 | Cole | |
| 8,101,267 B2 | 1/2012 | Samuels et al. | |
| 8,133,621 B2 | 3/2012 | Wormald et al. | |
| 8,199,506 B2 | 6/2012 | Janik et al. | |
| 8,287,336 B2 | 10/2012 | Dangler et al. | |
| 8,325,486 B2 | 12/2012 | Arshad et al. | |
| 8,393,918 B2 | 3/2013 | Cheng et al. | |
| 8,431,445 B2 | 4/2013 | Robert | |
| 8,455,990 B2 | 6/2013 | Warren et al. | |
| 8,516,269 B1 | 8/2013 | Hamlet et al. | |
| 8,589,703 B2 | 11/2013 | Lee et al. | |
| 8,646,108 B2 | 2/2014 | Shiakallis et al. | |
| 8,659,506 B2 | 2/2014 | Nomizo | |
| 8,659,908 B2 | 2/2014 | Adams et al. | |
| 8,664,047 B2 | 3/2014 | Lower et al. | |
| 8,716,606 B2 | 5/2014 | Kelley et al. | |
| 8,723,304 B2 | 5/2014 | Kang et al. | |
| 8,797,059 B2 | 8/2014 | Boday et al. | |

(56) References Cited

U.S. PATENT DOCUMENTS

| | | |
|---|---|---|
| 8,836,509 B2 | 9/2014 | Lowy |
| 8,853,839 B2 | 10/2014 | Gao et al. |
| 8,879,266 B2 | 11/2014 | Jarvis et al. |
| 8,890,298 B2 | 11/2014 | Buer et al. |
| 8,947,889 B2 | 2/2015 | Kelley et al. |
| 8,961,280 B2 | 2/2015 | Dangler et al. |
| 9,003,199 B2 | 4/2015 | Dellmo et al. |
| 9,011,762 B2 | 4/2015 | Seppa et al. |
| 9,052,070 B2 | 6/2015 | Davis et al. |
| 9,166,586 B2 | 10/2015 | Carapelli et al. |
| 9,298,956 B2 | 3/2016 | Wade et al. |
| 9,554,477 B1 | 1/2017 | Brodsky et al. |
| 9,555,606 B1 | 1/2017 | Fisher et al. |
| 9,560,737 B2 | 1/2017 | Isaacs et al. |
| 9,578,764 B1 | 2/2017 | Fisher et al. |
| 9,661,747 B1 | 5/2017 | Brodsky et al. |
| 9,717,154 B2 | 7/2017 | Brodsky et al. |
| 2001/0049021 A1 | 12/2001 | Valimont |
| 2001/0050425 A1 | 12/2001 | Beroz et al. |
| 2001/0056542 A1 | 12/2001 | Cesana et al. |
| 2002/0001193 A1 | 1/2002 | Osawa et al. |
| 2002/0002683 A1 | 1/2002 | Benson |
| 2002/0068384 A1 | 6/2002 | Beroz et al. |
| 2002/0084090 A1 | 7/2002 | Farquhar |
| 2003/0009684 A1 | 1/2003 | Schwenck et al. |
| 2005/0045358 A1* | 3/2005 | Arnold ............... H05K 9/0024 174/51 |
| 2005/0068735 A1 | 3/2005 | Fissore et al. |
| 2005/0111194 A1 | 5/2005 | Sohn et al. |
| 2005/0161253 A1 | 7/2005 | Heitmann et al. |
| 2005/0180104 A1 | 8/2005 | Olesen et al. |
| 2006/0034731 A1 | 2/2006 | Lewis et al. |
| 2006/0049941 A1 | 3/2006 | Hunter et al. |
| 2006/0072288 A1 | 4/2006 | Stewart et al. |
| 2006/0080348 A1 | 4/2006 | Cesana et al. |
| 2006/0196945 A1 | 9/2006 | Mendels |
| 2006/0218779 A1 | 10/2006 | Ooba et al. |
| 2007/0038865 A1 | 2/2007 | Oggioni et al. |
| 2007/0064396 A1 | 3/2007 | Oman et al. |
| 2007/0064399 A1 | 3/2007 | Mandel et al. |
| 2007/0108619 A1 | 5/2007 | Hsu |
| 2007/0211436 A1 | 9/2007 | Robinson et al. |
| 2007/0230127 A1 | 10/2007 | Peugh et al. |
| 2007/0268671 A1 | 11/2007 | Brandenburg et al. |
| 2008/0050512 A1 | 2/2008 | Lower et al. |
| 2008/0086876 A1 | 4/2008 | Douglas |
| 2008/0144290 A1 | 6/2008 | Brandt et al. |
| 2008/0159539 A1 | 7/2008 | Huang et al. |
| 2008/0160274 A1 | 7/2008 | Dang et al. |
| 2008/0191174 A1 | 8/2008 | Ehrensvard et al. |
| 2008/0251906 A1 | 10/2008 | Eaton et al. |
| 2009/0073659 A1 | 3/2009 | Peng et al. |
| 2009/0132018 A1* | 5/2009 | DiUbaldi ............ A61N 1/0456 607/152 |
| 2009/0166065 A1 | 7/2009 | Clayton et al. |
| 2010/0088528 A1 | 4/2010 | Sion |
| 2010/0110647 A1 | 5/2010 | Hiew et al. |
| 2010/0177487 A1* | 7/2010 | Arshad ............... G06F 21/86 361/737 |
| 2010/0279521 A1* | 11/2010 | Hougham ............ H05K 3/326 439/66 |
| 2010/0319986 A1 | 12/2010 | Bleau et al. |
| 2011/0001237 A1 | 1/2011 | Brun et al. |
| 2011/0038123 A1 | 2/2011 | Janik et al. |
| 2011/0103027 A1 | 5/2011 | Aoki et al. |
| 2011/0134303 A1* | 6/2011 | Jung ............... H01L 27/14618 348/340 |
| 2011/0241446 A1 | 10/2011 | Tucholski |
| 2011/0299244 A1 | 12/2011 | Dede et al. |
| 2012/0050998 A1 | 3/2012 | Klum et al. |
| 2012/0117666 A1* | 5/2012 | Oggioni ............... G06F 21/87 726/34 |
| 2012/0140101 A1* | 6/2012 | Afshari ............... H04N 5/2257 348/308 |
| 2012/0140421 A1 | 6/2012 | Kirstine et al. |
| 2012/0151098 A1* | 6/2012 | Sullivan ............ G06F 1/1607 710/13 |
| 2012/0319986 A1 | 6/2012 | Toh et al. |
| 2012/0170217 A1 | 7/2012 | Nishikimi et al. |
| 2012/0185636 A1 | 7/2012 | Leon et al. |
| 2012/0218727 A1* | 8/2012 | Kim ................... H05K 9/0028 361/767 |
| 2012/0229984 A1* | 9/2012 | Guo ................... H05K 7/209 361/704 |
| 2012/0244742 A1 | 9/2012 | Wertz et al. |
| 2012/0256305 A1* | 10/2012 | Kaufmann ............ G06F 21/87 257/659 |
| 2012/0320529 A1 | 12/2012 | Loong et al. |
| 2013/0020572 A1 | 1/2013 | He et al. |
| 2013/0021758 A1 | 1/2013 | Bernstein et al. |
| 2013/0033818 A1 | 2/2013 | Hosoda et al. |
| 2013/0057757 A1* | 3/2013 | Ryou ................... G02B 7/08 348/374 |
| 2013/0058052 A1 | 3/2013 | Arshad et al. |
| 2013/0104252 A1 | 4/2013 | Yanamadala et al. |
| 2013/0141137 A1 | 6/2013 | Krutzik et al. |
| 2013/0154834 A1 | 6/2013 | Bucsa et al. |
| 2013/0158936 A1 | 6/2013 | Rich et al. |
| 2013/0208422 A1 | 8/2013 | Hughes et al. |
| 2013/0235527 A1 | 9/2013 | Wagner et al. |
| 2013/0271905 A1* | 10/2013 | Sullivan ............... G06F 1/16 361/679.02 |
| 2013/0283386 A1 | 10/2013 | Lee |
| 2014/0022733 A1 | 1/2014 | Lim et al. |
| 2014/0027159 A1 | 1/2014 | Salle et al. |
| 2014/0028335 A1 | 1/2014 | Salle et al. |
| 2014/0033331 A1 | 1/2014 | Salle et al. |
| 2014/0092296 A1* | 4/2014 | Han ................... H04N 5/2257 348/373 |
| 2014/0160679 A1 | 6/2014 | Kelty et al. |
| 2014/0183506 A1* | 7/2014 | Koizumi ............ H01L 51/0021 257/40 |
| 2014/0184263 A1 | 7/2014 | Ehrenpfordt et al. |
| 2014/0204533 A1 | 7/2014 | Abeyasekera et al. |
| 2014/0206800 A1 | 7/2014 | Wu et al. |
| 2014/0233165 A1 | 8/2014 | Farkas et al. |
| 2014/0296410 A1 | 10/2014 | Cheng et al. |
| 2014/0306014 A1 | 10/2014 | Salle et al. |
| 2014/0321064 A1 | 10/2014 | Bose et al. |
| 2014/0325688 A1 | 10/2014 | Cashin et al. |
| 2015/0007427 A1 | 1/2015 | Dangler et al. |
| 2015/0163933 A1* | 6/2015 | Steiner ............... H05K 5/0208 174/50.51 |
| 2015/0213243 A1 | 7/2015 | Hughes et al. |
| 2015/0235053 A1 | 8/2015 | Lee et al. |
| 2015/0244374 A1 | 8/2015 | Hadley |
| 2016/0005262 A1 | 1/2016 | Hirato et al. |
| 2016/0137548 A1 | 5/2016 | Cabral, Jr. et al. |
| 2016/0262270 A1 | 9/2016 | Isaacs et al. |
| 2016/0316570 A1* | 10/2016 | De Vaan ............ H05K 1/0284 |
| 2017/0089729 A1 | 3/2017 | Brodsky et al. |
| 2017/0089977 A1 | 3/2017 | Warnock et al. |
| 2017/0091491 A1 | 3/2017 | Dangler et al. |
| 2017/0091492 A1 | 3/2017 | Brodsky et al. |
| 2017/0094778 A1 | 3/2017 | Brodsky et al. |
| 2017/0094783 A1 | 3/2017 | Dangler et al. |
| 2017/0094784 A1 | 3/2017 | Brodsky et al. |
| 2017/0094803 A1 | 3/2017 | Dangler et al. |
| 2017/0094804 A1 | 3/2017 | Brodsky et al. |
| 2017/0094805 A1 | 3/2017 | Dangler et al. |
| 2017/0094806 A1 | 3/2017 | Brodsky et al. |
| 2017/0094808 A1 | 3/2017 | Brodsky et al. |
| 2017/0094819 A1 | 3/2017 | Brodsky et al. |
| 2017/0094820 A1 | 3/2017 | Brodsky et al. |
| 2017/0094847 A1 | 3/2017 | Fisher et al. |
| 2017/0108543 A1 | 4/2017 | Brodsky et al. |
| 2017/0111998 A1 | 4/2017 | Brodsky et al. |
| 2017/0116830 A1 | 4/2017 | Isaccs et al. |

(56) References Cited

U.S. PATENT DOCUMENTS

2017/0171999 A1 6/2017 Fisher et al.
2017/0181274 A1 6/2017 Brodsky et al.

FOREIGN PATENT DOCUMENTS

| | | |
|---|---|---|
| DE | 19816571 A1 | 10/1999 |
| DE | 19816572 A1 | 10/1999 |
| DE | 10-2012-001862 A1 | 8/2013 |
| DE | 10-2012-203955 A1 | 9/2013 |
| EP | 0 056 360 A1 | 10/1993 |
| EP | 0 629 497 A2 | 12/1994 |
| EP | 1 184 773 A1 | 3/2002 |
| EP | 1 207 444 A2 | 5/2002 |
| EP | 1 734 578 A1 | 12/2006 |
| EP | 1 968 362 A2 | 9/2008 |
| EP | 2 104 407 A1 | 9/2009 |
| EP | 1 672 464 B1 | 4/2012 |
| EP | 2 560 467 A1 | 2/2013 |
| JP | 61-297035 A | 12/1986 |
| JP | 2000-238141 A | 9/2000 |
| JP | 5194932 B2 | 5/2013 |
| JP | 2013-125807 A | 6/2013 |
| JP | 2013-140112 A | 7/2013 |
| WO | WO 1999/003675 A1 | 1/1999 |
| WO | WO 1999/021142 A1 | 4/1999 |
| WO | WO 2001/063994 A2 | 8/2001 |
| WO | WO 2003/012606 A2 | 2/2003 |
| WO | WO 2003/025080 A1 | 3/2003 |
| WO | WO 2004/040505 A1 | 5/2004 |
| WO | WO 2009/042335 A1 | 4/2009 |
| WO | WO 2009/092472 A1 | 7/2009 |
| WO | WO 2010/128939 A1 | 11/2010 |
| WO | WO 2013/004292 A1 | 1/2013 |
| WO | WO 2013/0189483 A1 | 12/2013 |
| WO | WO 2014/086987 A2 | 6/2014 |
| WO | WO 2014/158159 A1 | 10/2014 |

OTHER PUBLICATIONS

List of IBM Patents or Patent Applications Treated as Related, Jul. 15, 2016, pp. 1-2.
Siegel, Adam C. et al., "Foldable Printed Circuit Boards on Paper Substrates," Advanced Functional Materials (www.afm-journal.de), vol. 20, Issue 1, Jan. 8, 2010, pp. 28-35.
Holm, Ragnar, "Electric Contacts: Theory and Application", Spinger-Verlag, New York, 4th Edition, 1981 (pp. 10-19).
Clark, Andrew J., "Physical Protection of Cryptographic Devices", Advanced in Cyprtology, Eurocrypt '87, Springer, Berlin Heidelberg (1987) (11 pages).
Halperin et al., "Latent Open Testing of Electronic Packaging", MCMC-194, IEEE (1994) (pp. 83-33).
Simek, Bob, "Tamper Restrictive Thermal Ventilation System for Enclosures Requiring Ventilation and Physical Security", IBM Publication No. IPCOM000008607D, Mar. 1, 1998 (2 pages).
NIST, "Security Requirements for Cryptographic Modules", FIPS Pub. 140-2, Issued May 25, 2001.
Pamula et al., "Cooling of Integrated Circuits Using Droplet-Based Microfluidics", Association for Computing Machinery (ACM), GLSVLSI'03, Apr. 28-29, 2003 (pp. 84-87).
Saran et al., "Fabrication and Characterization of Thin Films of Single-Walled Carbon Nanotube Bundles on Flexible Plastic Substrates", Journal of the American Chemical Society, vol. 126, No. 14 (Mar. 23, 2004) (pp. 4462-4463).
Khanna P.K. et al., "Studies on Three-Dimensional Moulding, Bonding and Assembling of Low-Temperature-Cofired Ceramics MEMS and MST Applications." Materials Chemistry and Physics, vol. 89, No. 1 (2005) (pp. 72-79).
Drimer et al., "Thinking Inside the Box: System-Level Failures of Tamper Proofing", 2008 IEEE Symposium on Security and Privacy, (Feb. 2008) (pp. 281-295).
Loher et al., "Highly Integrated Flexible Electronic Circuits and Modules", 3rd International IEEE on Microsystems, Packaging, Assembly & Circuits Technology Conference (Oct. 22-24, 2008) (Abstract Only) (1 page).
Sample et al., "Design of an RFID-Based Battery-Free Programmable Sensing Platform", IEEE Transactions on Instrumentation and Measurement, vol. 57, No. 11, Nov. 2008 (pp. 2608-2615).
Jhang et al., "Nonlinear Ultrasonic Techniques for Non-Destructive Assessment of Micro Damage in Material: A Review", International Journal of Prec. Eng. & Manuf., vol. 10, No. 1, Jan. 2009 (pp. 123-135).
Anonymous, "Consolidated Non-Volatile Memory in a Chip Stack", IBM Technical Disclosure: IP.com No. IPCOM000185250, Jul. 16, 2009 (6 pages).
Isaacs et al., "Tamper Proof, Tamper Evident Encryption Technology", Pan Pacific Symposium SMTA Proceedings (2013) (9 pages).
Anonymous, "Selective Memory Encryption", IBM Technical Disclosure: IP.com IPCOM000244183, Nov. 20, 2015 (6 pages).
Zhou et al., "Nonlinear Analysis for Hardware Trojan Detection", ICSPCC2015, IEEE (2015) (4 pages).
Harting Mitronics, "Saftey Caps for Payment Terminals", http://harting-mitronics.ch/fileadmin/hartingmitronics/case_studies/Saftey_caps_for_payment_terminals.pdf, downloaded Aug. 2016 (2 pages).
Gold Phoenix Printed Circuit Board, "Why multilayer pcb is used so widely?", May 7, 2012, accessed online @ [http://www.goldphoenixpcb.com/html/Support_Resource/others/arc_110.html] on Feb. 15, 2017.
Busby et al., "Multi-Layer Stack with Embedded Tamper-Detect Protection", U.S. Appl. No. 15/053,336, filed Feb. 25, 2016 (68 pages).
Campbell et al., "Tamper-Proof Electronic Packages With Two-Phase Dielectric Fluid", U.S. Appl. No. 15/139,503, filed Apr. 27, 2016 (60 pages).
Busby et al., "Tamper-Proof Electronic Packages Formed With Stressed Glass", U.S. Appl. No. 15/154,077, filed May 13, 2016 (45 pages).
Busby et al., "Tamper-Proof Electronic Packages With Stressed Glass Component Substrate(s)", U.S. Appl. No. 15/154,088, filed May 13, 2016 (56 pages).
Busby et al., "Tamper-Respondent Assembly with Nonlinearity Monitoring", U.S. Appl. No. 15/194,738, filed Jun. 28, 2016 (48 pages).
Dragone et al., "Tamper-Respondent Assembly with Sensor Connection Adapter", U.S. Appl. No. 15/268,959, filed Sep. 19, 2016 (45 pages).
Dragone et al., "Vented Tamper-Respondent Assemblies", U.S. Appl. No. 15/275,748, filed Sep. 26, 2016 (53 pages).
Dragone et al., "Tamper-Respondent Assemblies with In Situ Vent Structure(s)", U.S. Appl. No. 15/275,762, filed Sep. 26, 2016 (72 pages).
Busby et al., "Tamper-Respondent Assemblies with Trace Regions of Increased Susceptibility to Breaking", U.S. Appl. No. 15/341,108, filed Nov. 2, 2016 (56 pages).
Brodsky et al., "Tamper-Respondent Assembly with Flexible Tamper-Detect Sensor(s) Overlying In-Situ-Formed Tamper-Detect Sensor", U.S. Appl. No. 15/430,842, filed Feb. 13, 2017 (61 pages).

* cited by examiner

CIRCUITIZED STRUCTURE WITH 3-DIMENSIONAL CONFIGURATION

BACKGROUND

The background of aspects of the present disclosure is hereinafter introduced with the discussion of techniques relating to its context. However, even when this discussion refers to documents, acts, artifacts and the like, it does not suggest or represent that the discussed techniques are part of the prior art or are common general knowledge in the field relevant to the present disclosure.

One or more aspects of the present disclosure relate to the field of electronics. More specifically, one or more aspects relate to circuitized structures.

Circuitized structures (i.e., insulating substrates supporting electric circuits) are commonly used in several applications. A typical example is a Printed Circuit Board (PCB), which comprises a laminate of glass fiber, (thermosetting) resin and metal (with one or more layers of metal that are suitably patterned to define the desired electric circuit). The PCB is generally used to mount electronic devices (wherein the insulating substrate supports the electronic devices and the electric circuit interconnects them). Moreover, a particular type of circuitized structure is an Insulated Metal Substrate (IMS), which further comprises a dissipation plate of metal that is laminated with the insulating substrate. The dissipation plate is thicker than the insulating substrate, which in turn is thicker than the electric circuit. The IMS is generally used to mount electronic devices of power type (with the dissipation plate that facilitates the dissipation of heat that is produced by the electronic devices in operation).

The above-mentioned circuitized structures are rigid, with a substantially bi-dimensional, or flat, configuration. Therefore, they are unsuitable to make circuitized structures with a 3-Dimensional (3-D) configuration. Indeed, any attempt to bend these (rigid) circuitized structures is very likely to damage them. This is especially true for the IMSs, because of their highly asymmetrical construction. Particularly, during any bending the inner part and the outer part of any rigid circuitized structure are subject to compressive deformations and to tensile deformations, respectively. This may cause cracks in the outer part of the insulating substrate (because of the relatively low resistance to tensile stresses of most of the resins). Moreover, in the inner part of the insulating substrate this may cause cracks as well (if the resin is relatively hard) or wrinkles (if the resin is relatively soft). The insulating substrate may also transmit strains to the electric circuit; these strains (in addition to the ones already caused by the bending) may compromise the integrity of the electric circuit. In addition, during the bending the insulating substrate stretches and slides with respect to the dissipation plate and to the electric circuit. This may cause a delamination of the circuitized structure, since adhesion between the insulating substrate and the dissipation plate/electric circuit is mostly given by mechanical intimacy between the resin and the roughness (peaks and valleys) of the corresponding metal. All of the above may create opens in the electric circuit and/or paths for short circuits (to the dissipation plate).

Another example of a circuitized structure is a Flexible Printed Circuit (FPC), wherein the insulating substrate is made of a flexible material (for example, polyimide). The FPC allows the circuitized structure to conform to specific shapes or to bend during its use. However, the FPCs may be unsuitable to support the weight of the electronic devices mounted thereon and/or to protect them efficiently from a mechanical point of view.

Therefore, a stiffener (for example, a metal sheet) may be attached to the FPC (on the opposite side of its electric circuit) to make it more rigid. Rigid-flex printed circuits are also available, wherein a rigid metal substrate is laminated with the (flexible) insulating substrate. However, the above-mentioned circuitized structures require manufacturing processes that are not standard, and thus, relatively expensive. This limits their use only to special products for low volume applications.

SUMMARY

A summary of aspects of the present disclosure is herein presented in order to provide a basic understanding thereof; however, the sole purpose of this summary is to introduce some concepts of the disclosure in a simplified form as a prelude to its following more detailed description, and it is not to be interpreted as an identification of its key elements nor as a delineation of its scope.

In general terms, one or more aspects of the present disclosure are based on the idea of forming an insulating substrate when it is partially cured.

Particularly, an aspect provides a method for manufacturing a circuitized structure with a 3-dimensional configuration. The method includes providing a base structure comprising an insulating substrate of electrically insulating material with a flat configuration and an electric circuit comprising at least one layer of electrically conductive material arranged on the insulating substrate. The insulating material includes a thermosetting material being partially cured by stopping a cure thereof at a B-stage before reaching the gel point. The method further includes forming the base structure according to the 3-dimensional configuration, and completing the cure of the thermosetting material.

A further aspect provides a circuitized structure with a 3-dimensional configuration. The circuitized structure includes an insulating substrate of electrically insulating material comprising a cured thermosetting material, the insulating substrate being formed according to the 3-dimensional configuration; and an electric circuit comprising at least one layer of electrically conductive material arranged on the insulating substrate.

A further aspect provides an electronic assembly comprising the circuitized structure.

BRIEF DESCRIPTION OF THE DRAWINGS

Features and aspects of the present invention will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). In this respect, it is expressly intended that the figures are not necessarily drawn to scale (with some details that may be exaggerated and/or simplified) and that, unless otherwise indicated, they are merely used to illustrate the structures and procedures described herein conceptually.

As examples.

DETAILED DESCRIPTION

Figure 1:
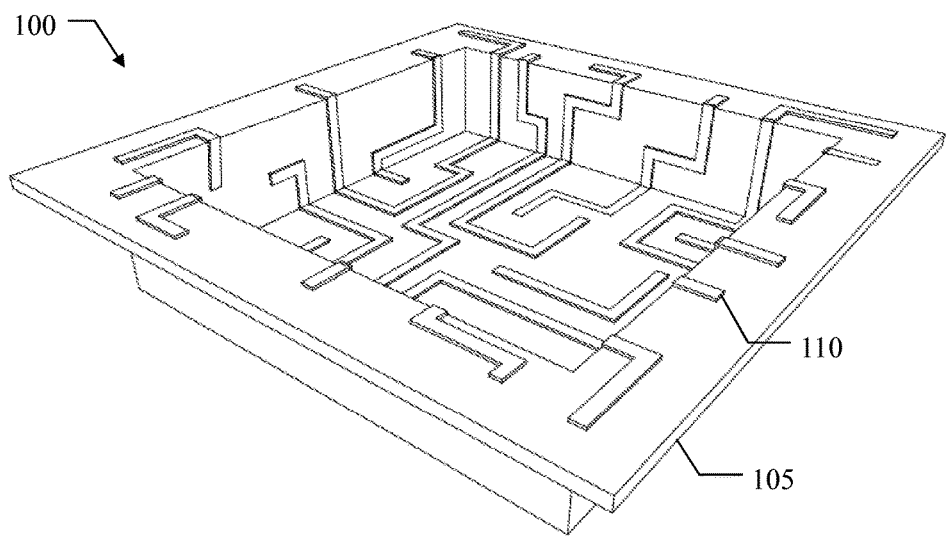
FIG. 1 shows a pictorial representation of a circuitized structure according to an embodiment of the present disclosure.

With reference to FIG. 1, a pictorial representation is shown of a circuitized structure 100 according to an embodiment of the present disclosure. The circuitized structure 100 is rigid (i.e., it does not deform significantly in normal operating conditions); moreover, the circuitized structure 100 has a 3-D configuration (i.e., it is not flat).

In one embodiment, the circuitized structure 100 includes an insulating substrate 105 that provides a 3-D configuration and the physical characteristics of the circuitized structure 100 (such as good dimensional stability, thermal stability, chemical resistance and electrical properties). The insulating substrate 105 is made, for instance, of an electrical insulating material that comprises a thermosetting (polymeric) material (for example, a thermosetting epoxy). Generally, a thermosetting material is a resin (i.e., a material capable of solidifying) that is set with a cure process. The cure is a chemical process (most often activated thermally), in which small reactive molecules (often monomers) of an uncured thermosetting material cross-link into polymers; the process is irreversible (so that the cured thermosetting material may not be remolded).

The circuitized structure 100 includes an electric circuit 110 that is arranged on the insulating substrate 105 (e.g., inside it in the example at issue). The electric circuit 110 comprises a layer (or more) of electrical conductive material (for example, copper) superimposed on the insulating substrate 105 (and then conforming to its 3-D configuration), which is patterned as a network of tracks.

Figure 2:
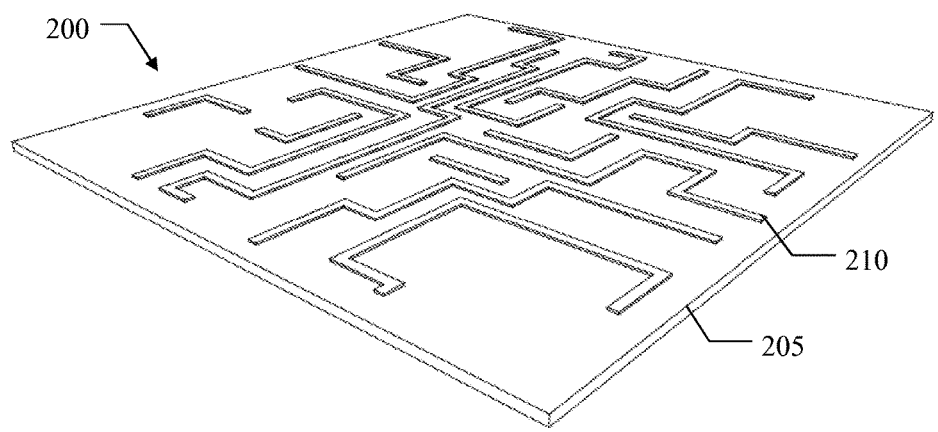
FIG. 2 shows a base structure that may be used to manufacture the circuitized structure according to an embodiment of the present disclosure.

With reference now to FIG. 2, a base structure 200 is shown that may be used to manufacture the circuitized structure according to an embodiment of the present disclosure.

As described in detail in the following, the circuitized structure is manufactured by forming the base structure 200. For this purpose, the base structure 200 includes an insulating substrate 205 corresponding to a net of the insulating substrate of the circuitized structure. The insulating substrate 205 is flat (i.e., it has the shape of a plate with two main surfaces that are arranged in substantially parallel planes). Moreover, the base structure 200 includes an electric circuit 210 corresponding to a net of the electric circuit of the circuitized structure; the electric circuit 210 is preemptively warped according to a predefined deformation (for example, determined with theoretical models or finite element simulations) so as to provide the desired 3-D configuration after the forming of the base structure 200 into the circuitized structure. The electric circuit 210 is arranged on the insulating substrate 205 (e.g., on one of its main surfaces), and then it is flat as well.

In a solution according to an embodiment of the present disclosure, the thermosetting material of the insulating substrate 205 is partially cured.

Figure 3:
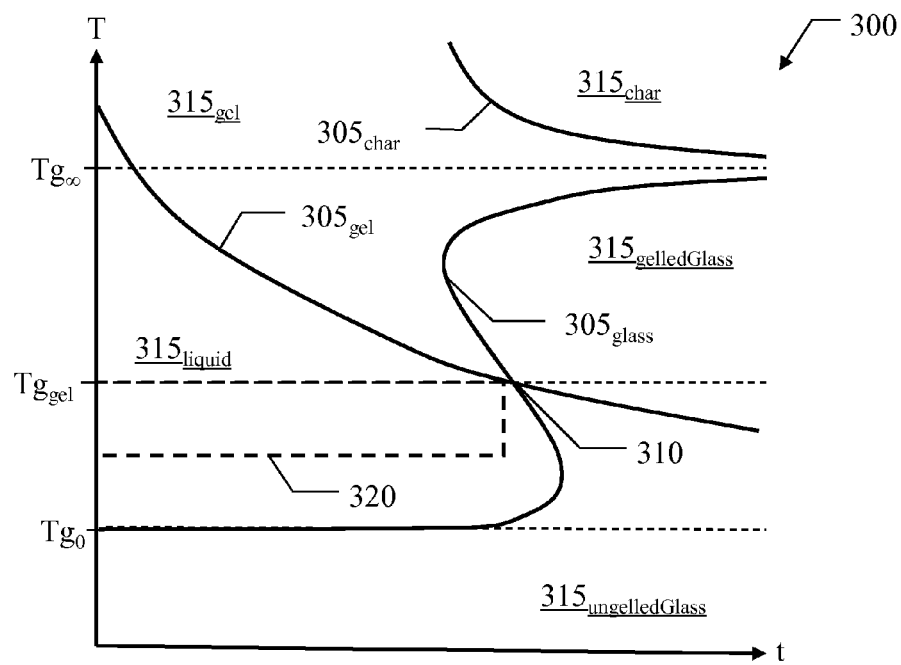
FIG. 3 shows an isothermal transformation diagram of an exemplary thermosetting material that may be used to implement the solution according to an embodiment of the present disclosure.

For instance, reference is made to FIG. 3 that shows an isothermal transformation diagram 300 of an example thermosetting material that may be used to implement a solution according to an embodiment of the present disclosure.

The diagram 300, also known as a Time-Temperature-Transformation (TTT) diagram, plots a time t (in arbitrary units in logarithmic scale on the abscissa axis) required to obtain any transition of the thermosetting material versus a temperature T thereof (in arbitrary units on the ordinate axis); therefore, each point of the diagram 300 indicates a condition of the thermosetting material when it is maintained at the corresponding temperature for the corresponding time.

The diagram 300 includes a gel curve $305_{gel}$ identifying the points in which the thermosetting material becomes gel (at corresponding gel transition temperatures after corresponding times to gel), a glass curve $305_{glass}$ identifying the points in which the thermosetting material becomes glass (at corresponding glass transition temperatures after corresponding times to glass), and a char curve $305_{char}$ identifying the points in which the thermosetting material decomposes into powder (at corresponding char transition temperatures after corresponding times to char). The transitions to gel (gelation) and to powder (decomposition) are irreversible, whereas the transition to glass (vitrification) is reversible. The gel curve $305_{gel}$ and the glass curve $305_{glass}$ intersect at a point 310, wherein the gelation and the vitrification coincide. A portion $315_{liquid}$ of the diagram 300 before reaching both the gel curve $305_{gel}$ and the glass curve $305_{glass}$ defines a liquid region in which the thermosetting material is (viscoelastic) liquid. A portion $315_{gel}$ of the diagram 300 after reaching the gel curve $305_{gel}$ and before reaching the glass curve $305_{glass}$ or the char curve $305_{char}$ defines a gel region in which the thermosetting material is gelled rubber. A portion of the diagram 300 after reaching the glass curve $305_{glass}$ defines a glass region in which the thermosetting material is glass; particularly, a portion $315_{ungelledGlass}$ of the diagram 300 after reaching the glass curve $305_{glass}$ from the liquid region $315_{liquid}$ defines an ungelled glass region in which the thermosetting material is ungelled glass, whereas a portion $315_{gelledGlass}$ of the diagram 300 after reaching the glass curve $305_{glass}$ from the gel region $315_{gel}$ defines a gelled glass region in which the thermosetting material is gelled glass. A portion $315_{char}$ of the diagram 300 after reaching the char curve $305_{char}$ defines a char region in which the thermosetting material is decomposed into powder.

Three critical glass transition temperatures may be identified on the diagram 300, in which the thermosetting material becomes glass. Particularly, an (uncured) glass transition temperature $Tg_0$ defines the maximum temperature (substantially above ambient temperature) at which the thermosetting material (completely uncured) is always glass; below the glass transition temperature $Tg_0$, the cure is substantially negligible over time, so as to allow its storage at temperatures sufficiently below it (for example, by 20-50° C.). A (gel) glass transition temperature $Tg_{gel}$ defines the temperature at which gelation and vitrification coincide, as defined by the point 310; between the glass transition temperatures $Tg_0$ and $Tg_{gel}$, the thermosetting material vitrifies before gelifying. A (cured) glass transition temperature $Tg_\infty$ defines the maximum temperature at which the thermosetting material (completely cured) vitrifies; between the glass transition temperatures $Tg_{gel}$ and $Tg_\infty$, the thermosetting material gelifies before vitrifying.

Figure 4:
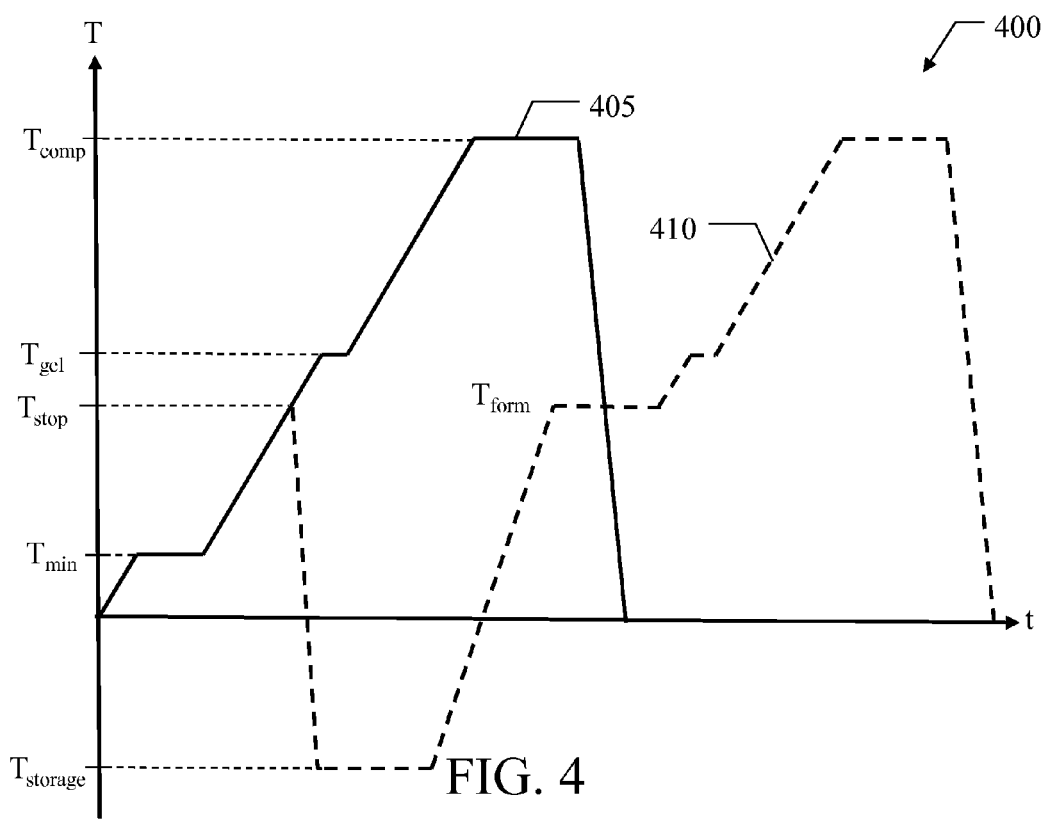
FIG. 4 shows a cure diagram of an exemplary thermosetting material that may be used to implement the solution according to an embodiment of the present disclosure.

With reference now to FIG. 4, a cure diagram 400 is shown of an example thermosetting material that may be used to implement a solution according to an embodiment of the present disclosure.

The diagram 400 plots the temperature T, in arbitrary units on the ordinate axis, versus the time t, in arbitrary units on the abscissa axis; a cure curve 405 defines a cure process (or cycle) of the thermosetting material by its (cure) temperature over the (cure) time.

Generally, in every cure process the point (time and temperature) at which the thermosetting material becomes gel with its irreversible transformation thereto is called a gel point. From a molecular point of view, at the gel point the first covalent bonds connect across the thermosetting material, so that its molecular weight diverges to infinity; the thermosetting material at the gel point has a constant degree of cure (as defined by its chemical conversion) that is independent of the temperature (for example, of the order of 50-80%), i.e., gelation is an iso-conversional phenomenon. Macroscopically, this involves an abrupt increase of viscosity (approaching an infinite value) and the development of elastic properties (with the first appearance of an equilibrium, i.e., time independent, shear modulus). The gel point may be calculated if the chemistry of the thermosetting material is known, or it may be determined with Dynamic Mechanical Rheological Testing (DMRT) techniques at the point where the tangent of the mechanical damping (tan δ) momentarily becomes independent of frequency (for example, by making dynamic oscillatory measurements simultaneously at different frequencies with a Rheometric rheometer equipped with a MultiWave mode).

Moreover, the point (time and temperature) at which the thermosetting material becomes glass with its reversible transformation thereto is called a glass transition point. From a molecular point of view, the glass is an amorphous (non-crystalline) solid; the degree of cure of the thermosetting material at the glass point undergoes a significant decrease (by 2-3 orders of magnitude) and it falls below the chemical reaction rate (as the reaction becomes controlled by the diffusion of reactants). Macroscopically, the thermosetting material abruptly increases its rigidity and becomes relatively brittle. The glass transition point may be determined with Modulated-Temperature Differential Scanning calorimetry (MTDSC) techniques at the point where the heat capacity exhibits a step increase.

The thermosetting material usually passes through three different stages during its cure. Particularly, the thermosetting material completely uncured (when it is soluble and fusible) is in a so-called A-stage. The thermosetting material is cured by heating it; as a result, its monomers cross-link into oligomers and then into polymers (with its viscosity that increases, possibly after an initial decrease thereof). The thermosetting material partially cured below the gel point (when it is nearly insoluble, generally vitrified, but still thermoplastic) is in a so-called B-stage. The thermosetting material completely cured (when it is insoluble and not thermoplastic any longer) is in a so-called C-stage.

With reference now to the cure curve 405, during the corresponding cure process, the temperature is increased by heating the thermosetting material with a suitable heating rate (that provides a regular and uniform cure thereof) until the thermosetting material is completed cured. Particularly, the thermosetting material is initially heated to a minimum temperature $T_{min}$ (for example, 40-60° C. in 30-60 min.) so as to reach a minimum viscosity thereof. The temperature is then maintained constant at this value (for example, for 20-40 min.) to extend the period during which the thermosetting material has the minimum viscosity (for facilitating its processing). Later on, the thermosetting material is heated again to a gel temperature $T_{gel}$ (for example, 100-120° C. in 10-20 min.) so as to reach its gel point; in this phase, pressure is generally applied to the thermosetting material (before reaching the gel point) to improve its compactness (and possibly to control its degassing). The temperature may be maintained constant at this value (for example, for 10-20 min.) to reduce surface porosity. The thermosetting material is heated again to a completion temperature $T_{comp}$ (for example, 150-200° C. in 30-60 min.) and then maintained at this value (for example, for 60-120 min.) so as to complete its cure. At this point, the thermosetting material is cooled down to the ambient temperature.

In a solution according to an embodiment of the present disclosure, the cure of the thermosetting material (of the insulating layer in the base structure) is stopped at the B-stage, before the thermosetting material reaches its gel point.

In this way, the insulating layer is hard at touch and reasonably stiff to allow its processing with standard manufacturing operations; as a result, circuitized structures with 3-D configurations may be manufactured (with a few additional manufacturing steps) in a cost effective way, thereby making them suitable for mass production in high volume applications.

At the same time, the base structure may be formed (for example, by heating the insulating substrate so as to return its thermosetting material to viscoelastic liquid) without any damage (even when it has an asymmetrical construction). Indeed, the insulating substrate may now support the compressive deformations and the tensile deformations that are applied to its inner part and to its outer part, respectively, during the forming of the base structure. Particularly, the thermosetting material at the B-stage is capable of conforming to its new shape maintaining integrity; moreover, the thermosetting material substantially fills any space that may be created by the forming. This prevents the creation of cracks and wrinkles (so as to maintain continuity, simply with a reduced thickness). Therefore, the thermosetting material does not transmit strains to the electric circuit, with a beneficial effect on its integrity. In addition, the thermosetting material may slide with respect to the electric circuit, since it does not firmly adhere thereto yet; this prevents delamination of the circuitized structure and at the same time allows obtaining the desired 3-D configuration of the electric circuit (from its original configuration preemptively warped accordingly). All of the above avoids (or at least substantially reduces) the risk of creating opens in the electric circuit and/or paths for short circuits.

In an embodiment, the cure of the thermosetting material is stopped at a pre-defined percentage of an activation energy required for reaching its gel point. As indicated above, the gelation is an iso-conversional phenomenon, so that the time to gel versus the gel temperature may be used to measure its activation energy. For example, the cure of the thermosetting material may be stopped at a stop temperature $T_{stop}$ equal to 70-90%, e.g., 75-85% and still more particularly, for instance, 78-82%, such as 80% of the gel temperature $T_{gel}$.

As a further improvement, as shown in FIGS. 3-4, the stop temperature $T_{stop}$ is equal to or lower than the glass transition temperature $Tg_{gel}$ at which gelation and vitrification coincide (hereinafter referred to as gel-glass transition temperature $Tg_{gel}$); for example, the stop temperature $T_{stop}$ is equal to 70-100%, e.g., 80-90% and still more particularly, for instance, 83-87%, such as 85% of the gel-glass transition temperature $Tg_{gel}$. In this way, a corresponding (temperature and time) window 320 is available to form the thermosetting material (as described below) before its gel point is reached. The above-mentioned choice of the stop temperature $T_{stop}$ provides a good compromise between the opposed requirements of sufficient mechanical characteristics of the thermosetting material of the base structure (for manufacturing its electric circuit) and sufficient time for its forming (for obtaining the 3-D configuration of the circuitized structure).

In an embodiment, as shown in FIG. 4 by a curve 410 (in dashed line), the thermosetting material is then cooled rapidly (for example, in 5-10 min.) to a storage temperature $T_{storage}$, wherein the cure of the thermosetting material is quenched so as to obtain an ungelled glass. For example, the storage temperature $T_{storage}$ is 20-50° C. below the glass transition temperature $Tg_0$, so that the cure of the thermosetting material is substantially negligible over time thereby allowing its storage.

Later on, the thermosetting material is heated again to a form temperature $T_{form}$ so as to return the thermosetting material to (viscoelastic) liquid. The form temperature $T_{form}$ corresponds to the stop temperature $T_{stop}$, for example, with the form temperature $T_{form}$ equal to 90-120%, e.g., 93-115% and still more particularly, for instance, 95-110%, such as 110% of the stop temperature $T_{stop}$. The temperature is maintained constant at this value (for example, for 60-90 min.) during which the base structure is formed into the desired 3-D configuration of the circuitized structure. The cure process then proceeds as above, so as to lock the obtained 3-D configuration when the thermosetting material solidifies (as soon as its gel point is reached).

With reference now to FIG. 5A-FIG. 5H, the main phases are shown of a process for manufacturing a circuitized structure according to an embodiment of the present disclosure.

Figure 5A:
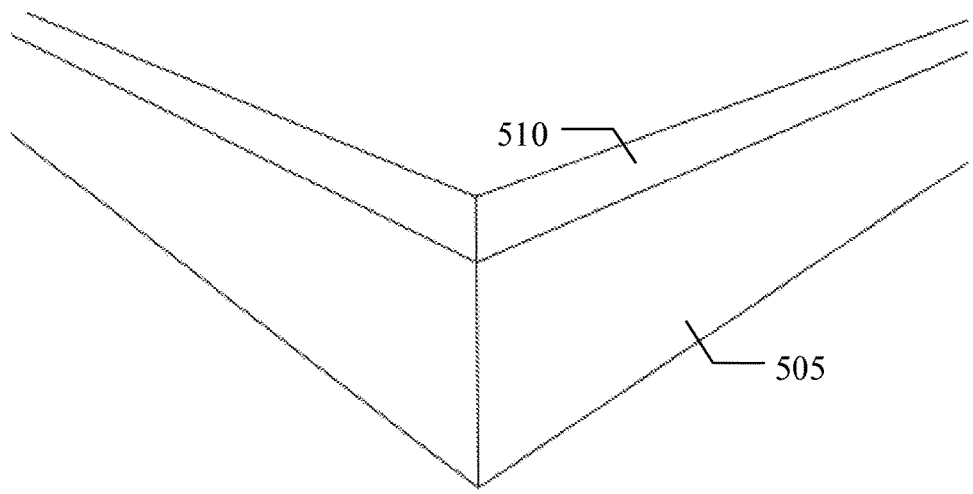
FIG. 5A-FIG. 5H show example main phases of a process for manufacturing a circuitized structure according to an embodiment of the present disclosure.

Starting from FIG. 5A, the process comprises the manufacturing of a base structure of the IMS type. In general, the manufacturing is performed at the level of a panel, wherein the same base structure is created simultaneously in a large number of identical areas thereof.

Particularly, a metal foil 505 of metal (for example, copper) is provided. The metal foil 505 is quite thin (for example, with a thickness of the order of 10-100 μm). A resistive layer 510 of electrical resistive material (for example, NiP) is deposited onto a main surface of the metal foil 505; the resistive layer 510 is far thinner than the metal foil 505 (for example, with a thickness of the order of 0.1-1 μm).

Figure 5B:
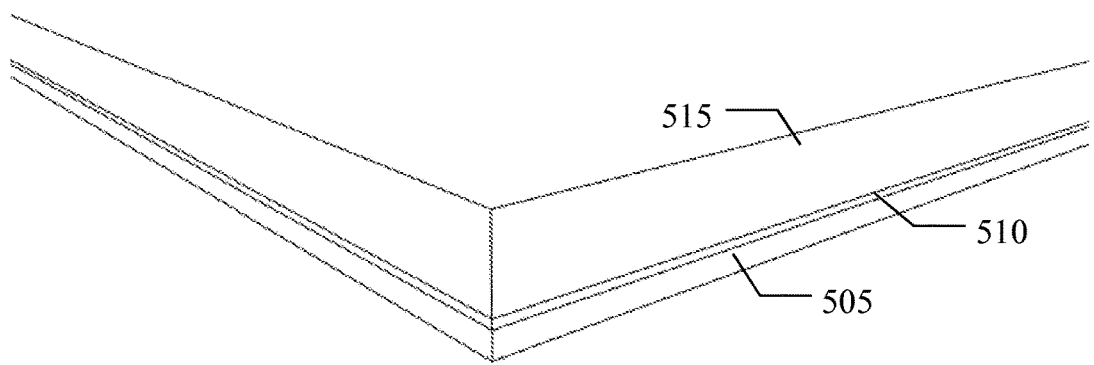

Moving to FIG. 5B, an insulating layer 515 of thermosetting material (for example, epoxy resin) is deposited onto the resistive layer 510 (on the opposite side of the metal foil 505); for this purpose, the thermosetting material is heated to its minimum temperature (at which it exhibits the minimum viscosity), and it is then dispensed onto the resistive layer 510 (so as to wet it uniformly). The insulating layer 515 is thicker than the metal foil 505, and then far thicker than the resistive layer 510 (for example, with a thickness of the order of 100-200 μm).

Figure 5C:
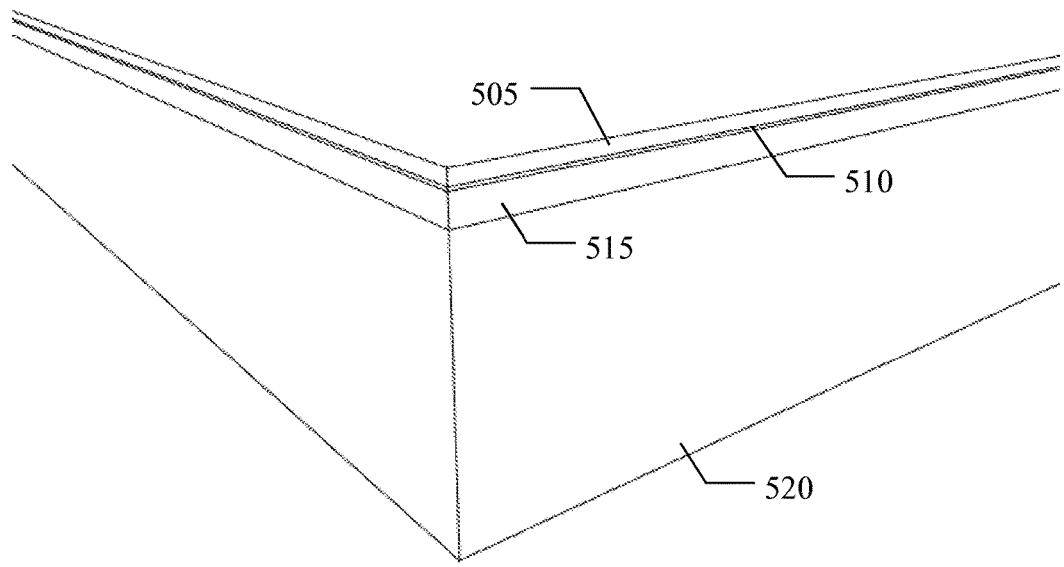

Moving to FIG. 5C, a dissipation sheet 520 of metal (for example, Aluminum) is provided. The dissipation sheet 520 has the same size as the structure formed by the metal foil 505, the resistive layer 510 and the insulating layer 515; however, the dissipation sheet 520 is far thicker than the insulating layer 515 (for example, with a thickness of the order of 0.5-2 mm). The structures 505-515 and the dissipation sheet 520 are laminated (with the dissipation sheet 520 facing the insulating layer 515). At this point, the thermosetting material of the insulating layer 515 is partially cured as described above (by stopping its cure at the B-stage before reaching the gel point), with the structure so obtained that is then cooled down to the ambient temperature. The metal foil 505 is patterned (for example, with standard photolithographic techniques) according to the electric circuit of the base structure (suitably warped).

Figure 5D:
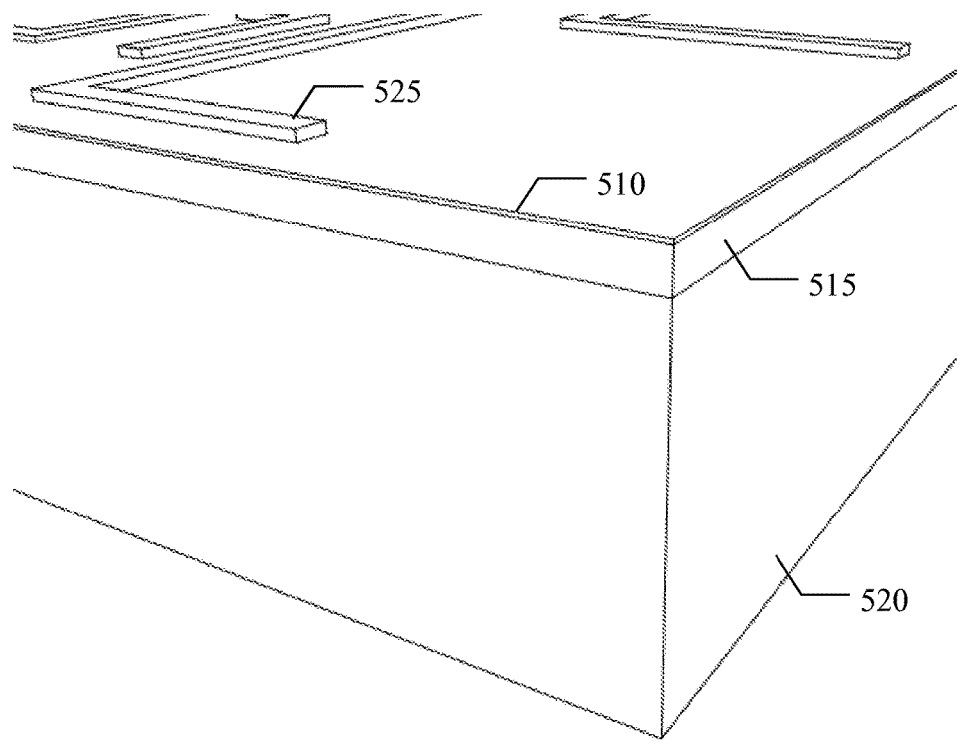

Moving to FIG. 5D, a corresponding metal circuit 525 (formed by the remaining part of the metal foil) is obtained; the metal circuit 525 exposes the resistive layer 510 wherein the metal foil has been removed. The resistive layer 510 is then etched selectively (for example, with a dry etching process) by using the metal circuit 525 as a protection mask.

Figure 5E:
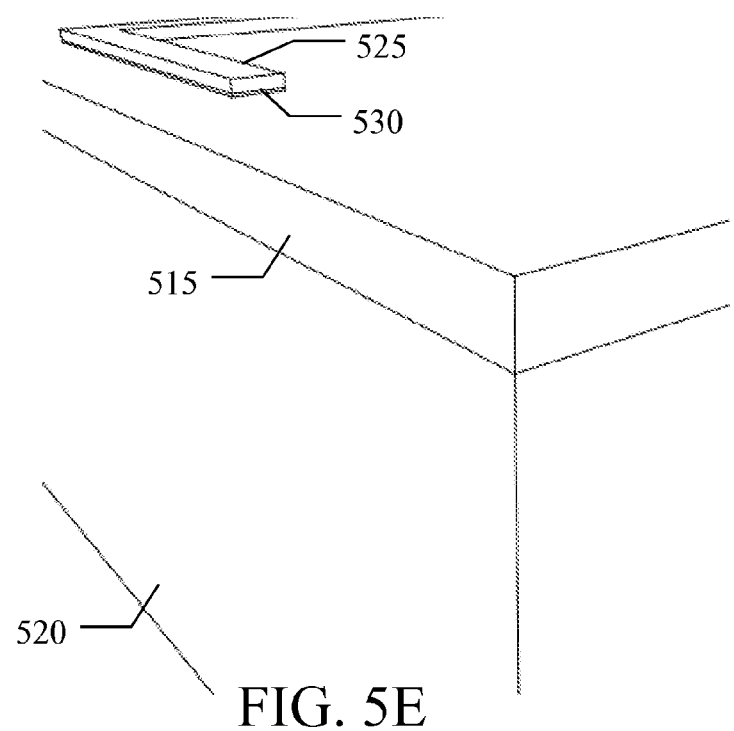

Moving to FIG. 5E, a corresponding resistive circuit 530 (formed by the remaining part of the resistive layer under the metal circuit 525) is obtained; the resistive circuit 530 exposes the insulating layer 515 wherein the resistive layer has been removed. The areas of the panel so obtained, wherein the desired base structures have been created, are then separated into these base structures through a cutting operation (for example, with each base structure having a circular shape with a radius of, e.g., the order of 3-6 cm). The base structures are frozen (for example, to −30/50° C.) so as to substantially prevent the cure of the thermosetting material to continue (during their storage and possible shipping to a different location).

Figure 5F:
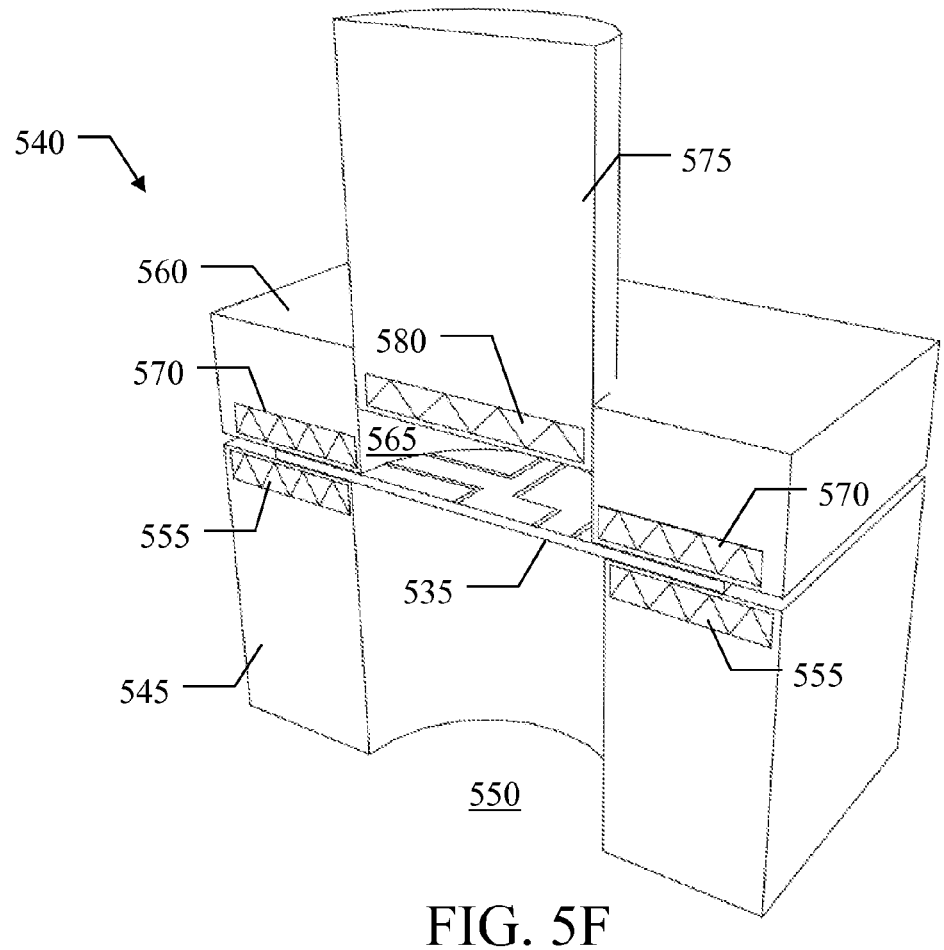

Moving to FIG. 5F, the process continues with the forming of each base structure, denoted with the reference 535, into the circuitized structure with the desired 3-D configuration; in an embodiment, the forming is based on a sheet metal forming technique of the deep drawing type (suitably customized). For this purpose, the base structure 535 is placed into a (deep drawing) press 540. The press 540 comprises a (forming) die 545 with a cavity 550 corresponding to the 3-D configuration of a central portion of the circuitized structure (for example, a hollow cylinder with a radius of the order of, e.g., 2-5 cm). One or more heaters 555 (for example, implemented by corresponding resistors) are embedded in the die 545, close to an upper surface thereof around the cavity 550. The press 540 includes a clamper 560 (arranged above the die 545) with a through hole 565 coaxial to the cavity 550; the through hole 565 has the same shape as but it is slightly narrower than the cavity 550. One or more heaters 570 are embedded in the clamper 560, close to a lower surface thereof around the hole 565 (facing the die 545). The press 540 includes a punch 575 matching the hole 565 (and then slightly narrower than the cavity 550). A heater 580 (or more) is embedded in the punch 575, close to a lower surface thereof (facing the die 545). The above-described structure is covered by a coating of thermally insulating material, so as to insulate it from a rest of the press 540 (not shown in the figure).

In operation, the clamper 560 and the punch 575 are raised and the base structure 535 is placed onto the die 545, around the cavity 550 (for example, by means of an automatic loader/unloader, not shown in the figure); the base structure 535 is larger than the cavity 550, so that a central portion thereof covers the cavity 550 and a peripheral portion thereof rests on the die 545. The clamper 560 is then lowered so as to hold the peripheral portion of the base structure 535 firmly on the die 545. In this condition, the heaters 555, 570 heat the base structure 535 (so as to start returning its thermosetting material to viscoelastic liquid).

Figure 5G:
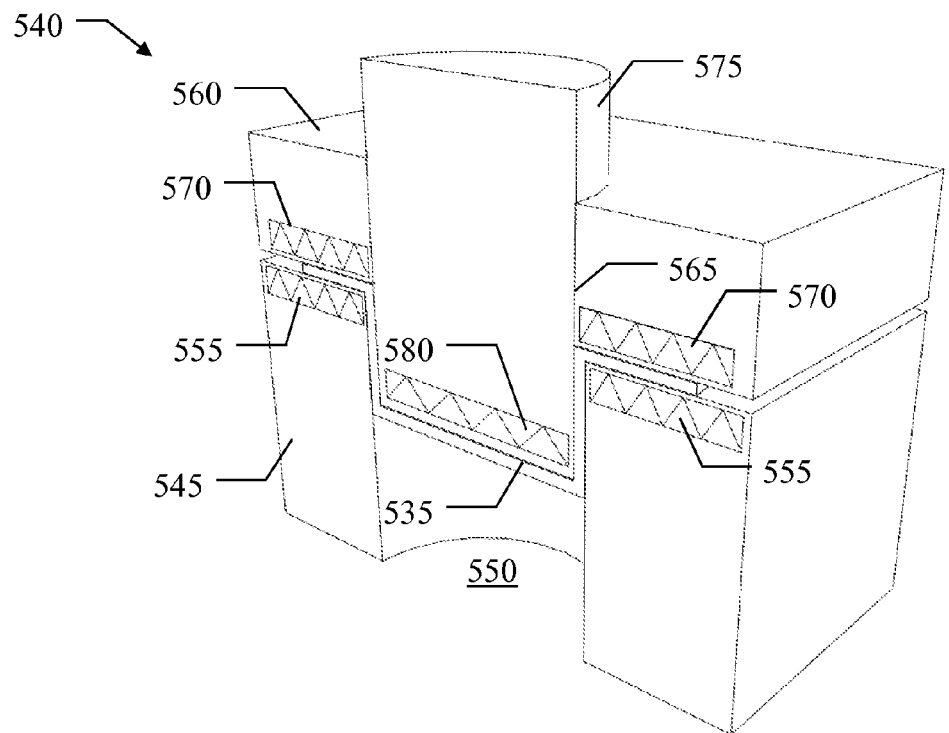

Moving to FIG. 5G, the punch 575 is lowered under pressure by sliding through the hole 565. When the punch 575 reaches the base structure 535, the heater 580 further heats it; at the same time, the mechanical pressure exerted by the punch 575 onto the central portion of the base structure 535 draws it into the cavity 550 (thanks to the clearance between the punch 575 and the cavity 550) so as to conform the base structure 535 to its shape and to create a flange defined by the peripheral portion of the base structure 535 (which remains held between the die 545 and the clamper 560 so as to prevent the base structure 535 from flowing freely into the cavity 550). During this operation, the punch 575 acts on the metal circuit that protects the underlying resistive circuit (not shown in the figure) from possible damages. Once the forming of the base structure 535 has been completed, the punch 575 and the clamper 560 are raised, so as to release the (formed) base structure 535 that may now be removed from the press 540 (for example, by means of the same automatic loader/unloader).

Figure 5H:
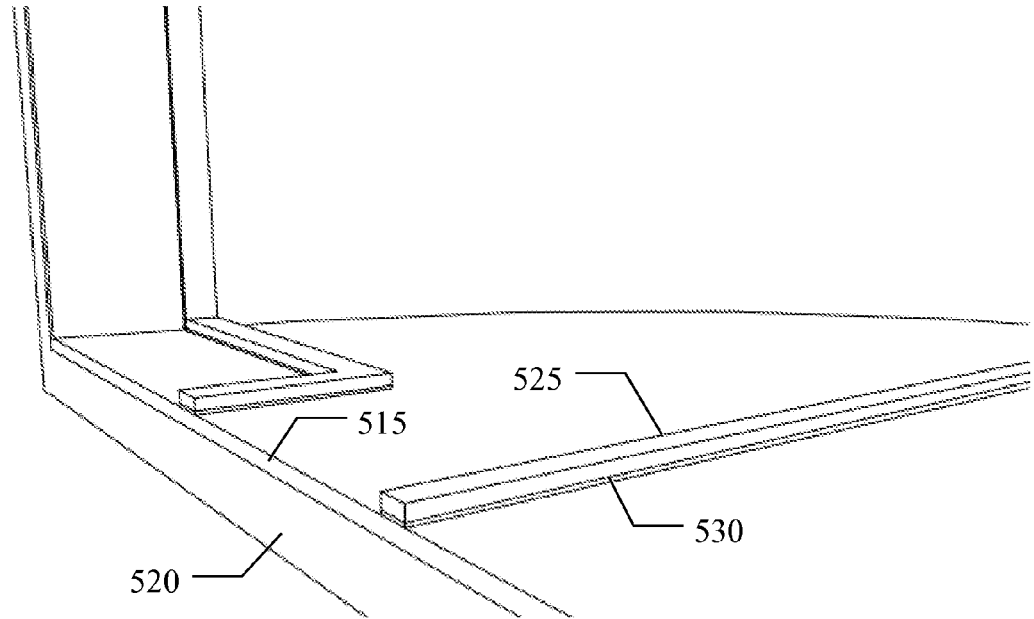

Moving to FIG. 5H, the cure of the thermosetting material of the base structure is completed (for example, in an oven not shown in the figure). The metal circuit 525 is now removed (for example, with a wet etching process) so as to expose the resistive circuit 530. As a result, the desired circuitized structure (with the electric circuit defined by the resistive circuit 530 arranged on the insulating substrate defined by the insulating layer 515, which is coupled with a dissipation layer defined by the dissipation sheet 520) is obtained.

This allows manufacturing the base structures in normal PCB production lines, and then forming it in (slightly modified) normal deep drawing lines (with a beneficial effect on their manufacturing costs).

Figure 6:
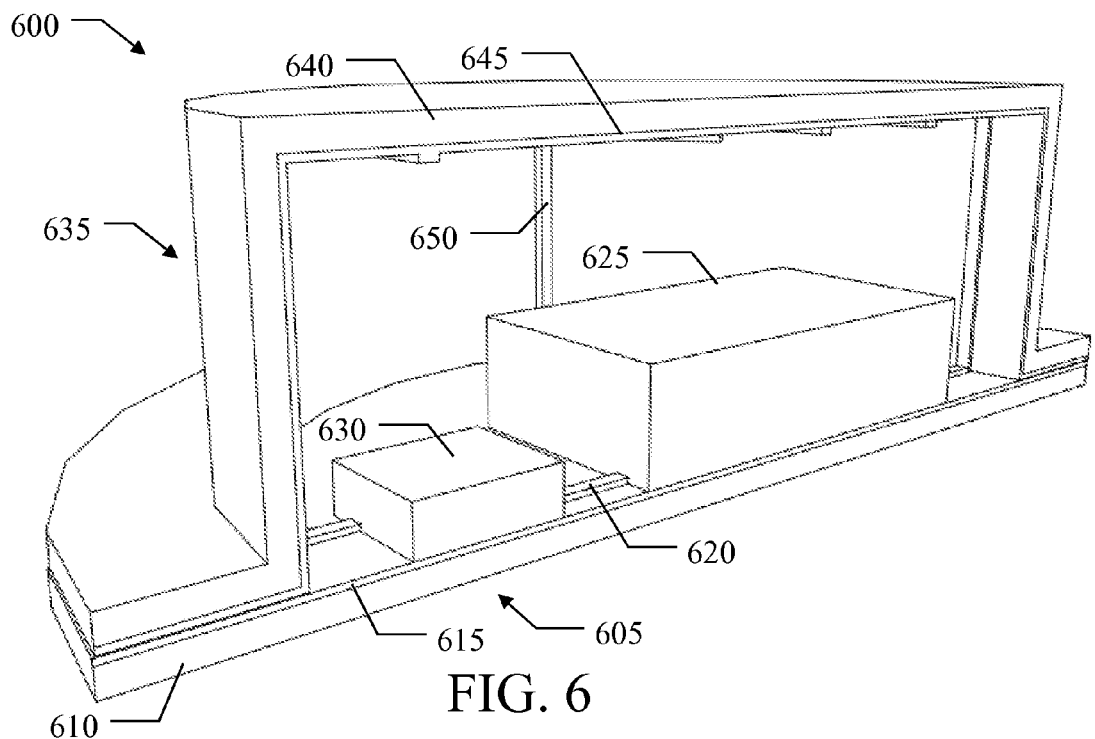
FIG. 6 shows an example of an application of the circuitized structure according to an embodiment of the present disclosure.

With reference now to FIG. 6, an example is shown of an application of the circuitized structure according to an embodiment of the present disclosure.

For example, this application relates to an electronic assembly 600 of a tamper-proof type. The electronic assembly 600 includes a (flat) circuitized carrier 605 formed by an IMS, having a dissipation layer 610 coupled with an insulating substrate 615 wherein an electric circuit 620 is arranged. An electronic device 625 integrated on a chip (or more) and a battery 630 (for example, of SMT type) are mounted on the circuitized carrier 605, so as to be coupled with the electric circuit 620; the electronic device 625 includes a memory that is used to store sensitive data (for example, cryptographic keys) and the battery 630 is used to supply the electronic device 625. The electronic assembly 600 includes a (3-D) circuited structure 635 as described above, having a dissipation layer 640 coupled with an insulating substrate 645 wherein an electric circuit 650 is arranged (in reality, the tracks of the electric circuits 620, 650 are far thinner and closely-arranged to create a sort of fence). The circuitized structure 635 defines a cap, with a hollow cylindrical shape having a lateral surface, a base closing the lateral surface at a longitudinal end thereof and a flange extending outwards from the lateral surface (parallel to the base) at another (open) longitudinal end thereof; the dissipation layer 640 is arranged outside the circuitized structure 635, whereas the electric circuit 650 is arranged inside the circuitized structure 635. The circuitized structure 635 is bonded (for example, soldered) on the circuitized carrier 605 around the electronic device 625 and the battery 630, with the electric circuit 650 facing the electric circuit 620. In this way, the electronic device 625, the battery 630 and the electric circuits 620, 650 are enclosed in a package formed by the circuitized carrier 605 and the circuitized structure 635 (having the appearance of a seamless enclosure); at the same time, the electric circuit 650 is coupled with the electric circuit 620 and then with the electronic device 625.

The electronic device 625 includes an electronic circuit that is configured for monitoring the electric circuits 620, 650 (for example, their continuity); should the electronic device 625 detect any alteration of the electric circuits 620, 650 (indicative of a possible attempt to tamper the electronic assembly 600), it immediately resets (cancels) its sensitive data so as to prevent any unauthorized access thereto. In an embodiment, the electric circuits 620, 650 are made of a material, for example, NiP, which is highly resistive (so as to reduce the power consumption of the electronic device 625 for their monitoring) and difficult to solder/glue (so as to hinder any attempt to probe it). Moreover, the electric circuits 620, 650 may be very thin (for example, with a thickness of 50-500 nm), so as to make them very hard (if not impossible) to detect by x-ray inspection. In an embodiment, the electric circuits 620, 650 have a random pattern, so as to hinder their shunting. All of the above significantly improves the resistance of the electronic assembly 600 to tampering; moreover, the dissipation layers 610, 635 implement a heat sink that facilitates the dissipation of heat generated by the electronic device 625 in operation.

Figure 7:
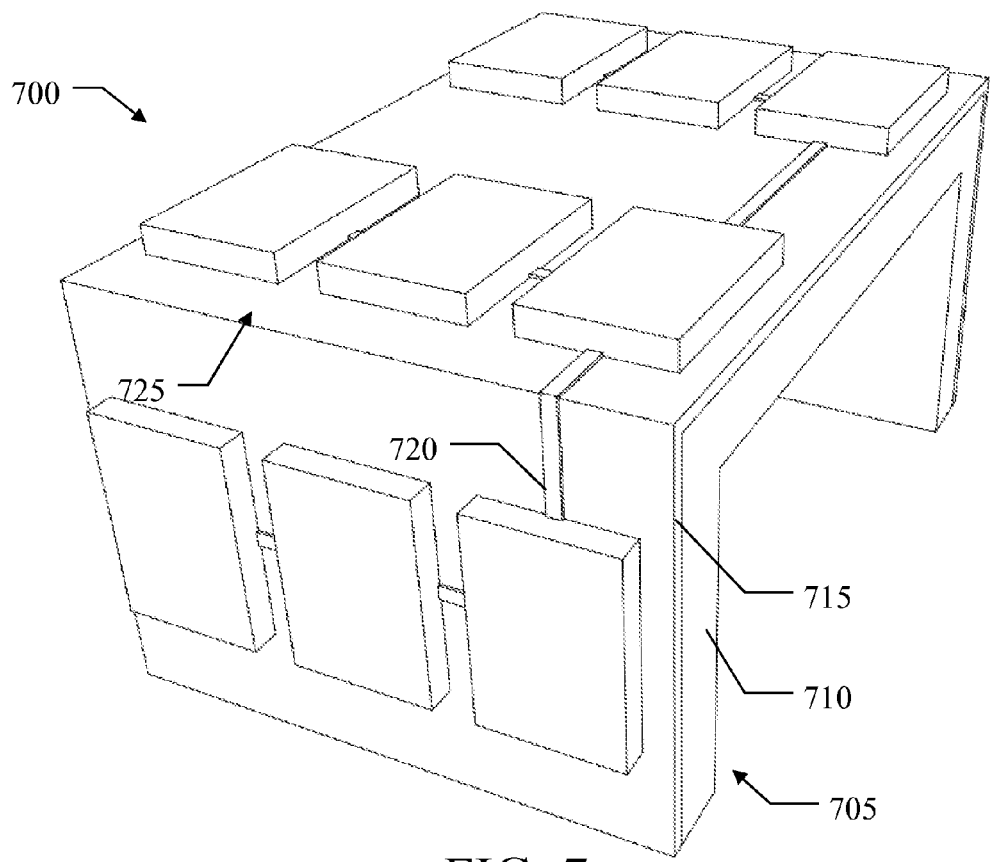
FIG. 7 shows another example of an application of the circuitized structure according to an embodiment of the present disclosure.

With reference now to FIG. 7, another example is shown of an application of the circuitized structure according to an embodiment of the present disclosure.

For example, this application relates to an electronic assembly 700 of a multi-chip type. The electronic assembly 700 includes a (3-D) circuited structure 705 as described above, having a dissipation layer 710 coupled with an insulating substrate 715 wherein an electric circuit 720 is arranged. The circuitized structure 705 defines a support, with a channel shape having a base and two lateral surfaces extending transversally from longitudinal edges thereof; the dissipation layer 710 is arranged inside the circuitized structure 705, whereas the electric circuit 720 is arranged outside the circuitized structure 705. A plurality of electronic devices 725 integrated on corresponding chips (for example, LEDs of STM type for lighting applications) are mounted on the circuitized structure 705, so as to be coupled with the electric circuit 720.

The 3-D configuration of the circuitized structure 705 substantially improves the compactness of the electronic assembly 700; moreover, its dissipation layer 710 implements a heat sink that facilitates the dissipation of heat generated by the electronic devices 725 in operation (for example, when a refrigerating fluid is forced to flow through the channel of the circuitized structure 705).

Figure 8:
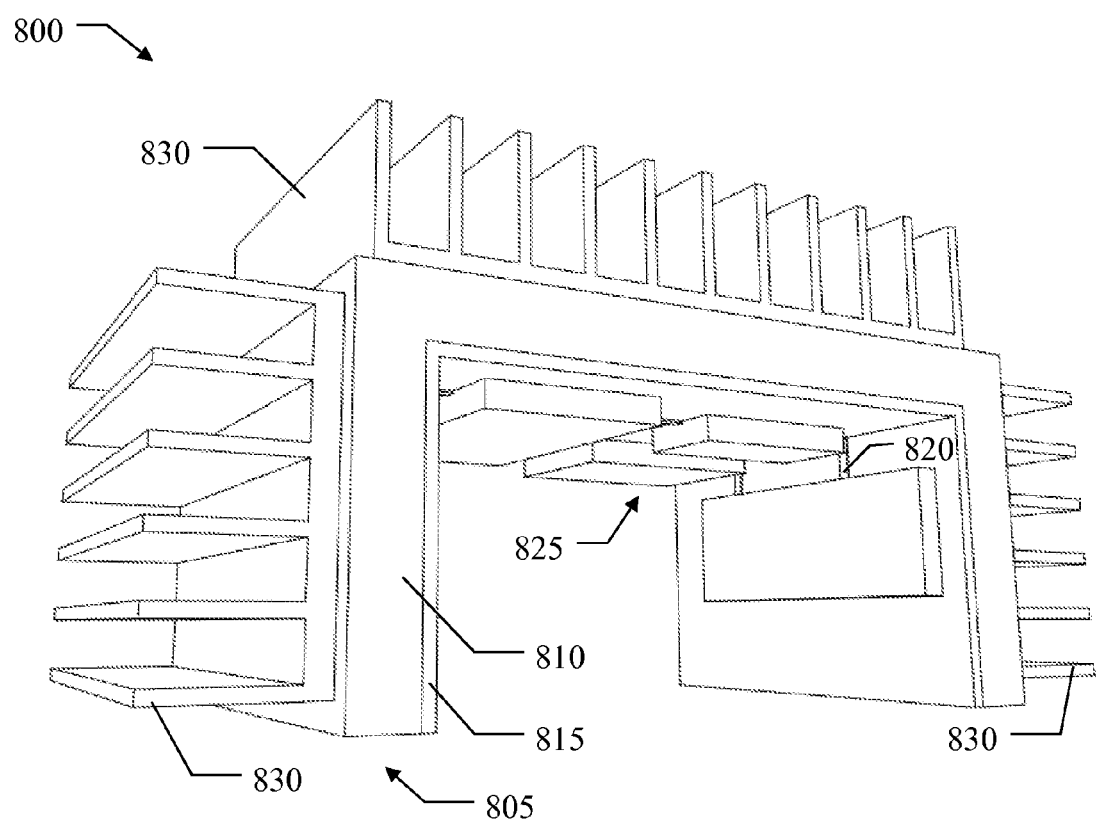
FIG. 8 shows another example of an application of the circuitized structure according to an embodiment of the present disclosure.

With reference now to FIG. 8, another example is shown of an application of the circuitized structure according to an embodiment of the present disclosure.

For example, this application relates to an electronic assembly 800 of a power type. The electronic assembly 800 includes a (3-D) circuited structure 805 as described above, having a dissipation layer 810 coupled with an insulating substrate 815 wherein an electric circuit 820 is arranged. The circuitized structure 805 defines a support, with a channel shape as above (having a base and two lateral surfaces); however, in this case the dissipation layer 810 is arranged outside the circuitized structure 805, whereas the electric circuit 820 is arranged inside the circuitized structure 805. A plurality of electronic devices 825 integrated on corresponding chips (for example, components of STM type for solar or wind generators) are mounted on the circuitized structure 805, so as to be coupled with the electric circuit 820; at least part of the electronic devices 825 are of a power type (i.e., they absorb relatively high power in operation, for example, 50-500 W). One or more heat spreaders 830 (for example, of the straight fin type) are fastened to the dissipation layer 810 (for example, on the base and the lateral surfaces of the circuitized structure 805).

In this case as well, the 3-D configuration of the circuitized structure 805 substantially improves the compactness of the electronic assembly 800; at the same time, the heat sink implemented by the dissipation layer 805 and the heat spreaders 830 provide a high thermal dissipation effectiveness.

Naturally, in order to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items); the terms based on, dependent on, according to, function of (and any forms thereof) should be intended as a non-exclusive relationship (i.e., with possible further variables involved); the term a/an should be intended as one or more items (unless expressly indicated otherwise); and the term means for (or any means-plus-function formulation) should be intended as any structure adapted or configured for carrying out the relevant function.

For example, an embodiment provides a method for manufacturing a circuitized structure with a 3-dimensional configuration.

However, the circuitized structure may have any size and shape (for example, with a circular, square, rectangular section, with or without any flange).

In an embodiment, the method comprises providing a base structure.

However, the base structure may have any size and shape (suitable to provide the desired circuitized structure).

In an embodiment, the base structure includes an insulating substrate of electrically insulating material with a flat configuration and an electric circuit comprising at least one layer of electrically conductive material arranged on the insulating substrate.

However, the electric circuit may include any number of layers (for example, two or more insulated layers interconnected by vias), with each layer that may be of any material, even not of metal type (for example, copper plated with nickel/gold); moreover, the insulating substrate and each layer of the electric circuit may have any thickness, and the electric circuit may have any topology and it may be arranged at any position (for example, on a single side or on both sides of the insulating substrate).

In an embodiment, the insulating material includes a thermosetting material.

However, the thermosetting material may be of any type, for example, phenolic resin, unsaturated polyester, polyurethane, dicyanate, bismaleimide, with or without additional components (for example, catalysts, particulate fillers, reinforcement fibers).

In an embodiment, the thermosetting material has been partially cured by stopping a cure thereof at a B-stage before reaching a gel point.

However, the thermosetting material may be cured according to any cure curve, or more generally in any other way, even not by heating (for example, by radiations); moreover, the point at which the cure has been stopped may be defined in several ways (see below).

In an embodiment, the method includes forming the base structure according to the 3-dimensional configuration.

However, the base structure may be formed in any way (see below).

In an embodiment, the method comprises completing the cure of the thermosetting material.

However, the cure may be completed in any way (for example, with the addition of post-cure operations).

In an embodiment, the step of forming the base structure includes heating the thermosetting material to a form temperature corresponding to a stop temperature at which the cure of the thermosetting material has been stopped.

However, the form temperature may be defined in any way according to the stop temperature (see below); in any case, the possibility of forming the base structure as soon as it has been manufactured is not excluded.

In an embodiment, the form temperature is equal to 90-120% of the stop temperature.

However, the form temperature may have different values (even independent of the stop temperature).

In an embodiment, the cure of the thermosetting material has been stopped at a stop temperature equal to 70-90% of a gel temperature of the thermosetting material at the gel point.

However, the stop temperature may have different values; more generally, the point at which the cure has been stopped may be defined in other ways (for example, by a percentage of the time to gel).

In an embodiment, the cure of the thermosetting material has been stopped at a stop temperature equal to or lower than a gel-glass transition temperature at which a gelation and a vitrification of the thermosetting material coincide.

However, the possibility of having the stop temperature (slightly) higher than the gel-glass transition temperature is not excluded.

In an embodiment, the stop temperature is equal to 70-100% of the gel-glass transition temperature.

However, the stop temperature may be a different percentage of the gel-glass transition temperature.

In an embodiment, the base structure includes a dissipation layer of thermally conductive material coupled with the insulating substrate at an opposite side of the electric circuit.

However, the dissipation layer may be made of any number and type of materials, even not of metal type (for example, copper, ceramics); in any case, the use of a base structure without the dissipation layer is contemplated (for example, for low power applications).

In an embodiment, a thickness of the dissipation layer is higher than a thickness of the insulating substrate and the thickness of the insulating substrate is higher than a thickness of the electric circuit.

However, the dissipation layer, the insulating substrate and the electric circuit may have any thickness (for example, either different or equal among all or part of them).

In an embodiment, the base structure includes a protection material covering the electric circuit; the method further includes removing at least part of the protection layer after forming the base structure.

However, the protection material may be of any type (either the same as or different from the one of the electric circuit) and it may have any configuration (for example, covering the electric circuit only or the whole base structure); moreover, the protection material may be removed in any way (for example, by sputtering), even in a selective way (so as to leave part of the electric circuit protected). In any case, the protection material may also be omitted (for example, when the electric circuit is particularly robust).

In an embodiment, the step of providing a base structure includes providing at least one conductive foil precursor of the electric circuit, depositing an insulating layer comprising the thermosetting material of the insulating substrate onto the at least one conductive foil, and patterning the at least one conductive foil into the electric circuit.

However, the base structure may be manufactured in different ways (for example, selectively depositing the electric circuit); in any case, the base structure may be provided already manufactured as an intermediate product.

In an embodiment, the step of providing a base structure includes laminating a dissipation sheet of thermally conductive material onto the insulating layer at an opposite side of the at least one conductive foil before the patterning thereof.

However, the insulating layer and the dissipation sheet may be assembled in different ways (for example, glued), even after patterning the conductive foil.

In an embodiment, the step of forming the base structure includes forming the base structure in a press having a die comprising a cavity corresponding to the 3-dimensional configuration.

However, the press may be of any type (see below); more generally, the base structure may be formed in different ways (for example, by bending, embossing).

In an embodiment, the step of forming the base structure in a press includes placing the base structure around the cavity of the die, clamping a peripheral portion of the base structure outside the cavity of the die, and pressing a central portion of the base structure into the cavity of the die.

However, the press may have a different structure (for example, with two matched dies, with any number of heaters, with a pre-heating system associated with the automatic loader/unloader) and it may operate in different ways (for example, by moving the die in addition or in alternative to the punch).

Generally, similar considerations apply if the same solution is implemented with an equivalent method (by using similar steps with the same functions of more steps or portions thereof, removing some steps being non-essential, or adding further optional steps); moreover, the steps may be performed in a different order, concurrently or in an interleaved way (at least in part).

A further embodiment provides a circuitized structure with a 3-dimensional configuration. The circuitized structure includes an insulating substrate of electrically insulating material comprising a cured thermosetting material; the insulating substrate has been formed according to the 3-dimensional configuration (when the thermosetting material was partially cured by stopping a cure thereof at a B-stage before reaching a gel point). The circuitized structure includes an electric circuit comprising at least one layer of electrically conductive material arranged on the insulating substrate.

However, the circuitized structure may be of any type (see above), with or without any number of the above-mentioned additional features (for example, the dissipation layer).

A further embodiment provides an electronic assembly comprising this circuitized structure and at least one electronic device coupled with the electric circuit.

However, the electronic assembly may be of any type (see below), and it may include any number and type of electronic devices (for example, naked chips, SMT packages).

In an embodiment, the electronic assembly is a tamper-proof electronic assembly.

However, the electronic assembly may be used for any purpose (for example, for storing electronic money credit).

In an embodiment, the electronic assembly includes at least one battery for supplying the at least one electronic device.

However, any number and type of batteries (down to none) may be provided.

In an embodiment, the electronic assembly includes a circuitized carrier; the circuitized carrier comprises a further insulating substrate of electrically insulating material and a further electric circuit comprising at least one further layer of electrically conductive material arranged on the further insulating substrate.

However, the circuitized carrier may be of any type (with the same considerations pointed out above for the circuitized structure that apply mutatis mutandis to it); moreover, the circuitized carrier may be either flat or with a 3-D configuration as well.

In an embodiment, the circuitized structure is bonded to the circuitized carrier to enclose the at least one electronic device, the at least one battery, the electric circuit and the further electric circuit, with the further electric circuit that is coupled with the electric circuit.

However, the circuitized structure may be bonded to the circuitized carrier in any way (for example, glued); moreover, the electric circuits may be coupled in any way (for example, with dedicated connections).

In an embodiment, the at least one electronic device includes a security circuit for detecting a physical intrusion by monitoring the electric circuit and the further electric circuit.

However, the security circuit may be implemented in any way (by software and/or by hardware), and it may monitor the electric circuits in any way (for example, by measuring their impedance continuously and detecting the intrusion when the measured values differ from a pre-defined normal value for two or more consecutive measures); moreover, the security circuit may take any action in response to the detection of the intrusion (for example, sending an alarm message).

In an embodiment, the at least one electronic device and the at least one battery are mounted on the circuitized carrier.

However, the electronic device(s) and the battery(ies) may be mounted in different positions (for example, on the circuitized structure in addition or in alternative).

In an embodiment, the at least one electronic device and the at least one battery are coupled with the further electric circuit.

However, the electronic device(s) and the battery(ies) may be coupled with the further electric circuit in any way (for example, by wire bonding techniques), or they may be coupled directly with the electric circuit (in addition or in alternative).

In an embodiment, the at least one electronic device is a plurality of electronic devices, which are mounted on the circuitized structure coupled with the electric circuit.

However, the electronic devices may be in any number and of any type (for example, naked chips, SMT packages); moreover, the electronic devices may be mounted at any positions (for example, only inside, only outside or both inside and outside the circuitized structure) and they may be coupled with the electric circuit in any way (for example, by wire bonding techniques).

In an embodiment, at least one of the electronic devices is a power electronic device.

However, the power electronic devices may be in any number and of any type (for example, power suppliers, inverters), either alone or combined with other electronic devices (for example, of signal processing type).

In an embodiment, the electronic assembly includes at least one heat spreader coupled with the dissipation layer.

However, the electronic assembly may include any number of heat spreaders of any type (for example, of pin type, or flared fin type); moreover, the heat spreaders may be coupled with the dissipation layer in any way (for example, glued) and at any position (either inside or outside the circuitized structure).

In any case, the above-described circuitized structure may be used with different configurations (for example, with power electronic devices mounted outside it and corresponding signal-processing electronic devices mounted inside it) and in alternative, different or additional applications (for example, automotive, avionic, train or naval constructions).

Moreover, the proposed electronic assembly may be mounted in intermediate products (such as motherboards); in any case, it is suitable to be used in complex systems (such as computers).

Generally, similar considerations apply if the circuitized structure and the electronic assembly each has a different structure or comprises equivalent components (for example, of different materials), or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

What is claimed is:

1. An electronic structure comprising:
    a circuitized cap structure comprising:
        a unitary, shaped support substrate formed of a cured thermosetting material, the unitary, shaped support substrate being a rigid, shaped support substrate formed to a non-planar, 3-dimensional configuration in the form of a cap with an outwardly extending flange at an open end of the cap; and
        an electric circuit comprising at least one layer of electrically conductive material arranged on the unitary, shaped support substrate on an inner surface of the cap and on a surface of the outwardly extending flange, the electric circuit comprising a first security circuit fence on the inner surface of the cap;
    a carrier substrate supporting an electronic device on a main surface thereof, the carrier substrate including a further electric circuit on the main surface of the carrier substrate supporting the electronic device, the further electric circuit comprising a second security circuit fence on the main surface of the carrier substrate supporting the electric device; and
    wherein the surface of the outwardly extending flange of the circuitized cap structure is sealed to the main surface of the carrier substrate, enclosing the electronic device between the circuitized cap structure and the carrier substrate, the first security circuit fence and the second security circuit fence defining a secure volume about the electronic device, with the first security circuit fence being configured to protect against tampering through the circuitized cap structure into the secure volume, including through the outwardly extending flange, and the second security circuit fence being configured to protect against tampering through the carrier substrate into the secure volume, and wherein the first and second security circuit fences, in part, face each other across the secure volume.

2. The electronic structure according to claim 1, wherein the circuitized cap structure further comprises a first dissipation layer of thermally conductive material coupled to an outer surface of the unitary, shaped support substrate at an opposite side of the unitary, shaped support substrate from the inner surface thereof with the electric circuit, a thickness of the first dissipation layer being greater than a thickness of the unitary, shaped support substrate and the thickness of the unitary, shaped support substrate being greater than a thickness of the electric circuit, and wherein the electronic structure further comprises a second dissipation layer of thermally conductive material coupled to another main surface of the carrier substrate, the main surface and the another main surface of the carrier substrate being opposite sides of the carrier substrate, and a thickness of the second dissipation layer being greater than a thickness of the carrier substrate.

3. The electronic structure of claim 1, wherein the first security circuit fence on the inner surface of the cap and the second security circuit fence on the main surface of the carrier substrate are each formed of a resistive material.

4. The electronic structure of claim 3, wherein the resistive material comprises nickel phosphorus (NiP).

5. The electronic structure of claim 1, wherein conductive lines of the first security circuit fence and the second security circuit fence have a thickness in the range of 50-500 nms.

6. The electronic structure of claim 1, wherein the first security circuit fence on the inner surface of the cap and the second security circuit fence on the main surface of the carrier substrate each have a random pattern.

7. The electronic assembly of claim 1, wherein the carrier substrate further supports at least one battery for supplying the electronic device, and wherein:
    the first security circuit fence on the inner surface of the cap and the second security circuit fence on the main surface of the carrier substrate are each formed of a resistive material; and conductive lines of the first security circuit fence and the second security circuit fence have a thickness in the range of 50-500 nms.

8. An electronic assembly comprising:
a circuitized structure with a non-planar 3-dimensional configuration, the circuitized structure comprising a unitary, shaped support substrate formed of a cured thermosetting material, the unitary, shaped support substrate being a rigid, shaped support substrate formed to the non-planar 3-dimensional configuration in the form of a cap with an outwardly extending flange at an open end of the cap, and an electric circuit comprising at least one layer of electrically conductive material arranged on the unitary, shaped support substrate on an inner surface of the cap and on a surface of the outwardly extending flange, the electric circuit comprising a first security circuit fence on the inner surface of the cap and on the surface of the outwardly extending flange;
a carrier substrate;
at least one electronic device disposed on a main surface of the carrier substrate, the carrier substrate including a further electric circuit on the main surface of the carrier substrate supporting the electronic device, the further electric circuit comprising a second security circuit fence on the main surface of the carrier substrate supporting the at least one electronic device; and
wherein the surface of the outwardly extending flange of the circuitized structure is bonded to the carrier substrate, enclosing the at least one electronic device between the circuitized structure and the carrier substrate, the first security circuit fence and the second security circuit fence defining a secure volume about the at least one electronic device, with the first security circuit fence being configured to protect against tampering through the circuitized cap structure into the secure volume, including through the outwardly extending flange, and the second security circuit fence being configured to protect against tampering through the carrier substrate into the secure volume, and wherein the first and second security circuit fences, in part, face each other across the secure volume.

9. The electronic assembly according to claim 8, wherein the circuitized structure further comprises a first dissipation layer of thermally conductive material coupled to an outer surface of the unitary, shaped support substrate at an opposite side of the unitary, shaped support substrate from the inner surface thereof with the electric circuit, and wherein a thickness of the first dissipation layer is greater than a thickness of the unitary, shaped support substrate and the thickness of the unitary, shaped support substrate is greater than a thickness of the electric circuit, and wherein the electronic structure further comprises a second dissipation layer of thermally conductive material coupled to another main surface of the carrier substrate, the main surface and the another main surface of the carrier substrate being opposite sides of the carrier substrate, and a thickness of the second dissipation layer being greater than a thickness of the carrier substrate.

10. The electronic assembly according to claim 8, wherein the electronic assembly is a tamper-proof electronic assembly comprising at least one battery for supplying the at least one electronic device, and for supplying the first and second security circuit fences; and
wherein the at least one electronic device comprises a security monitor circuit for detecting a physical intrusion by monitoring the electric circuit and the further electric circuit.

11. The electronic assembly according to claim 10, wherein the circuitized structure comprises a dissipation layer of thermally conductive material coupled to the unitary, shaped support substrate at an opposite side thereof from the electric circuit, and wherein a thickness of the dissipation layer is greater than a thickness of the unitary, shaped support substrate and the thickness of the unitary, shaped support substrate is greater than a thickness of the electric circuit.

12. The electronic assembly according to claim 11, further comprising at least one heat spreader coupled with the dissipation layer.

13. The electronic assembly of claim 10, wherein the first security circuit fence on the inner surface of the cap and the second security circuit fence on the main surface of the carrier substrate are each formed of a resistive material.

14. The electronic assembly of claim 13, wherein the resistive material comprises nickel phosphorus (NiP).

15. The electronic assembly of claim 10, wherein conductive lines of the first security circuit fence and the second security circuit fence have a thickness in the range of 50-500 nms.

16. The electronic assembly of claim 10, wherein the first security circuit fence on the inner surface of the cap and the second security circuit fence on the main surface of the carrier substrate each have a random pattern.

17. The electronic assembly of claim 10, wherein:
the first security circuit fence on the inner surface of the cap and the second security circuit fence on the main surface of the carrier substrate are each formed of a resistive material; and
wherein conductive lines of the first security circuit fence and the second security circuit fence have a thickness in the range of 50-500 nms.

* * * * *